(12) United States Patent
Tominaga et al.

(10) Patent No.: US 12,279,447 B2
(45) Date of Patent: Apr. 15, 2025

(54) SILICON CARBIDE SEMICONDUCTOR DEVICE

(71) Applicant: Mitsubishi Electric Corporation, Tokyo (JP)

(72) Inventors: Takaaki Tominaga, Tokyo (JP); Shiro Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 375 days.

(21) Appl. No.: 17/917,564

(22) PCT Filed: Jun. 24, 2020

(86) PCT No.: PCT/JP2020/024835
§ 371 (c)(1),
(2) Date: Oct. 7, 2022

(87) PCT Pub. No.: WO2021/260853
PCT Pub. Date: Dec. 30, 2021

(65) Prior Publication Data
US 2023/0155021 A1   May 18, 2023

(51) Int. Cl.
*H10D 30/66*   (2025.01)
*H10D 62/13*   (2025.01)
(Continued)

(52) U.S. Cl.
CPC ......... *H10D 30/665* (2025.01); *H10D 62/153* (2025.01); *H10D 62/8325* (2025.01);
(Continued)

(58) Field of Classification Search
CPC .. H10D 12/441; H10D 12/461; H10D 12/421; H10D 12/491; H10D 12/481;
(Continued)

(56) References Cited

U.S. PATENT DOCUMENTS

2011/0278599 A1   11/2011   Nakao et al.
2012/0061688 A1   3/2012   Watanabe et al.
(Continued)

FOREIGN PATENT DOCUMENTS

CN   107431090 A   12/2017
JP   2004-273647 A   9/2004
(Continued)

OTHER PUBLICATIONS

International Search Report and Written Opinion mailed on Sep. 15, 2020, received for PCT Application PCT/JP2020/024835, filed on Jun. 24, 2020, 8 pages including English Translation.
(Continued)

*Primary Examiner* — Scott B Geyer
*Assistant Examiner* — Cole Leon Lindsey
(74) *Attorney, Agent, or Firm* — XSENSUS LLP

(57) ABSTRACT

The present disclosure relates to a silicon carbide semiconductor device, and includes a p-type second well region provided as an upper layer portion of a semiconductor layer; an n-type second impurity region provided as an upper layer portion of the second well region; a p-type second well contact region provided as an upper layer portion of the second well region; a field insulating film provided on the second well region; a second contact passed through the field insulating film electrically connected to a first main electrode; a boundary gate insulating film provided on a boundary between the element region and the non-element region; a boundary gate electrode provided on the boundary gate insulating film; and a second main electrode. The second well contact region extends from below the second contact toward the element region, and the second impurity region extends from below the second contact toward the non-element region.

16 Claims, 24 Drawing Sheets

(51) Int. Cl.
  *H10D 62/832* (2025.01)
  *H10D 64/23* (2025.01)
  *H10D 64/27* (2025.01)

(52) U.S. Cl.
  CPC ......... *H10D 64/252* (2025.01); *H10D 64/259* (2025.01); *H10D 64/512* (2025.01)

(58) Field of Classification Search
  CPC .. H10D 12/032; H10D 12/035; H10D 12/038; H01L 29/7395; H01L 29/7396; H01L 29/7397; H01L 29/7398; H01L 29/66333; H01L 29/6634; H01L 29/66348
  See application file for complete search history.

(56) References Cited

U.S. PATENT DOCUMENTS

| 2013/0020587 | A1 | 1/2013 | Hino et al. | |
| 2019/0259845 | A1* | 8/2019 | Oritsuki | H01L 27/04 |
| 2020/0321462 | A1* | 10/2020 | Hino | H10D 62/107 |
| 2022/0149163 | A1* | 5/2022 | Ebihara | H01L 29/402 |

FOREIGN PATENT DOCUMENTS

| JP | 2011-61064 A | 3/2011 |
| WO | 2010/098294 A1 | 9/2010 |
| WO | 2011/007387 A1 | 1/2011 |
| WO | 2011/125274 A1 | 10/2011 |
| WO | 2016021077 A1 | 2/2016 |

OTHER PUBLICATIONS

Office Action and Search Report mailed Mar. 4, 2025 in corresponding Chinese application No. CN202080100712.4 (17 pages; with English machine translation).

* cited by examiner

SILICON CARBIDE SEMICONDUCTOR DEVICE

CROSS-REFERENCE TO RELATED APPLICATION

The present application is based on PCT filing PCT/JP2020/024835, filed Jun. 24, 2020, the entire contents of which are incorporated herein by reference.

TECHNICAL FIELD

The present disclosure relates to a silicon carbide semiconductor device, and more particularly, to a silicon carbide semiconductor device having a gate insulating film.

BACKGROUND ART

As a switching element used in an inverter circuit or the like, a vertical power semiconductor device is widely used, and in particular, a power semiconductor device having a metal-oxide semiconductor (MOS) structure is widely used. Typically, an insulated gate bipolar transistor (IGBT) and a metal-oxide semiconductor field-effect transistor (MOSFET) are used.

By using an n-type MOSFET that is one of silicon carbide semiconductor devices that use silicon carbide with a band gap about three times larger than a band gap of silicon (Si) as a semiconductor material, as a switching element for an inverter circuit, the power loss in the inverter circuit can be reduced.

An n-type MOSFET typically includes an n-type drift layer, and a p-type well that is provided on the n-type drift layer. When the MOSFET is switched from an on state to an off state, the drain voltage of the MOSFET, that is, the voltage at the drain electrode surges quickly, changing from approximately 0 V to several hundred V. A displacement current is then generated via a parasitic capacitance existing between the p-type well and the n-type drift layer. The displacement current generated on the side of the drain electrode flows into the drain electrode, and the displacement current generated on the side of the source electrode flows into the source electrode, via the p-type well. Furthermore, when the MOSFET is switched from the off state to the on state, a displacement current in the direction opposite to that generated at the time of switching from the on state to the off state flows through the p-type well.

According to Patent Document 1, a well contact hole is provided on an outermost p-type well positioned below a gate pad, in a manner passed through a field insulating film that has a film thickness greater than that of a gate insulating film and that is connected to a source electrode. This configuration allows the most of the displacement current flowing through the p-type well that has a large area and positioned below the gate pad, to flow into the source electrode via the well contact hole. Therefore, it is possible to suppress generation of a high electric field between the gate electrode and a p-type well immediately below the gate insulating film and formed on the opposite side of the well contact hole, being opposite with respect to the p-type well having a large area. In this manner, dielectric breakdown of the gate insulating film is prevented.

PRIOR ART DOCUMENT

Patent Document

Patent Document 1: WO 2011/125274 A

SUMMARY

Problem to be Solved by the Invention

In the technology disclosed in Patent Document 1, because a step-like level difference is formed between the well contact hole and a well end of the outermost p-type well, in the part where there is a thickness difference between the field insulating film and the gate insulating film at the well end of the outermost p-type well of the well contact hall, it is necessary to ensure some distance between the well contact hole and the well end of the outermost p-type well. Therefore, the gate insulating film is subjected to an electric field generated between a potential generated at the outermost p-type well and the potential at the gate electrode, the electric field being generated by a displacement current flowing from the side of well end of the outermost p-type well toward the well contact hole.

Most of the displacement current generated in the outermost p-type well flows into the outermost p-type well having a large area, on the opposite side of the well contact hole on the side of the well end of the outermost p-type well. Therefore, usually, a high voltage is not generated in the well end of the outermost p-type well, and no high electric field is generated in the gate insulating film.

However, there has been recently a demand for higher dV/dt that is a fluctuation of the drain voltage V with respect to the time t. For example, when high dV/dt that is 20 V/nsec or higher is required, the distance between the well contact hole and the side of the well end of the outermost p-type well becomes no longer ignorable, and a unignorable level of displacement current flows from the side of the well end of the outermost p-type well to the well contact hole, and a high voltage is generated in the well end of the outermost p-type well. This high voltage could be a cause of dielectric breakdown of the gate insulating film.

The present disclosure has been made to solve the problem described above, and an object of the present disclosure is to provide a silicon carbide semiconductor device capable of suppressing an electric field generated in a gate insulating film even with an application of high dV/dt.

Means to Solve the Problem

A silicon carbide semiconductor device according to the present disclosure is a silicon carbide semiconductor device that includes an element region provided with a semiconductor element and a non-element region other than the element region, and in which a main current flows in a thickness direction of a silicon carbide substrate in the element region, the silicon carbide semiconductor device also includes a semiconductor layer of a first conductivity type, the semiconductor layer being provided on a first main surface of the silicon carbide substrate; a first well region of a second conductivity type, the first well region being provided as an upper layer portion of the semiconductor layer in the element region; a first impurity region of the first conductivity type, the first impurity region being provided as an upper layer portion of the first well region; a first well contact region of the second conductivity type, the first well contact region being provided as the upper layer portion of the first well region and having a side surface bonded to the first impurity region; a gate insulating film provided on an end portion of the first impurity region, and on the first well region and the semiconductor layer; a gate electrode provided on the gate insulating film; a first contact brought into ohmic contact with the first impurity region and the first well contact region, and electrically connected to a first main electrode provided above the semiconductor layer; a second well region of the second conductivity type, the second well region being provided as an upper layer portion of the semiconductor layer of the non-element region; a second impurity region of the first conductivity type, the second impurity region being provided as an upper layer portion of the second well region; a second well contact region of the second conductivity type, the second well contact region being provided as the upper layer portion of the second well region and having a side surface bonded to the second impurity region; a field insulating film provided on the second well region, and at least one second contact passed through the field insulating film to form an ohmic contact with the second impurity region and the second well contact region, and electrically connected to the first main electrode; a boundary gate insulating film provided across a range between an end portion of the second impurity region and the end portion of the first impurity region, the end portion of the second impurity region being an end portion on a side nearer to a boundary between the element region and the non-element region, and the end portion of the first impurity region being an end portion of the first well region that is adjacent to the boundary; a boundary gate electrode provided on the boundary gate insulating film, and a second main electrode provided on a second main surface of the silicon carbide substrate, the second main surface being on an opposite side of the first main surface, in which the second well contact region extends from below the at least one second contact toward the element region, and the second impurity region extends from below the at least one second contact toward the non-element region.

Effects of the Invention

According to the silicon carbide semiconductor device according to the present disclosure, when the MOSFET is switched from the off state to the on state, because the second impurity region is formed, it is possible to ensure that a larger portion of the displacement current flowing from the at least one second contact flows into the side of the non-element region, than into the at least one second contact. Therefore, it is possible to reduce the amount of displacement current flowing into the side of the element region, than that into the second contact, to reduce the potential difference between the end of the second well region and the boundary gate electrode, and to suppress dielectric breakdown of the boundary gate insulating film.

DESCRIPTION OF EMBODIMENTS

Introduction

Figure 1:
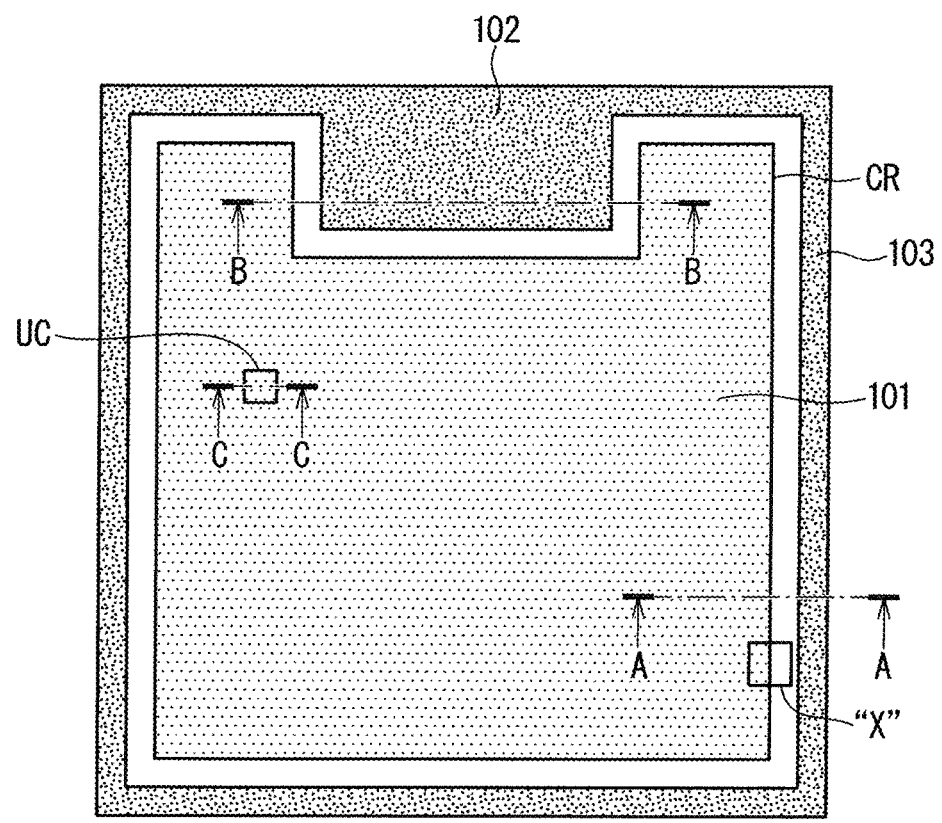
FIG. 1 is a plan view schematically illustrating an top surface configuration of a silicon carbide semiconductor device according to a first embodiment.

In the following description, an "element region" is a region through which a main current flows during an on state of a semiconductor element. In addition, in the following description, "outward" represents a direction toward the outer perimeter of the semiconductor element, and "inward" represents the direction opposite to the "outward".

Note that the drawings are schematically illustrated, and mutual relationships between sizes and positions of images illustrated in different drawings are not necessarily accurately illustrated, and can be changed as appropriate. In addition, in the following description, the same elements are denoted by the same reference numerals, and the same applies to the names and the functions thereof. Therefore, detailed descriptions thereof are sometimes omitted. In addition, in the present specification, expressions such as "on something" and "covering something" do not exclude the presence of any object interposed between such elements. For example, when there is a description that "B provided on A" or "A covers B", such a description may include a configuration in which another element C is provided between A and B, as well as a configuration without the element C. In addition, in the following description, terms meaning specific positions and directions such as "upper", "lower", "side", "bottom", "front", or "rear" are sometimes used, but these terms are used for the convenience in facilitating understanding of the description of the embodiments, and are not relevant to the directions in actual implementations.

In addition, the term "MOS" has been traditionally used for a metal-oxide-semiconductor junction structure. However, in a MOS field-effect transistor (MOSFET) having a MOS structure, in particular, the materials of a gate insulating film and a gate electrode have been improved, from the viewpoint of recent improvements in the integration, a manufacturing process, and the like.

For example, as a material of a gate electrode in a MOSFET, polycrystalline silicon has come to be adopted, instead of a metal, mainly from the viewpoint of forming a source and a drain in a self-aligned manner. Furthermore, from the viewpoint of improving electrical characteristics, a material having a high dielectric constant has come to be used as a material of the gate insulating film, although the material is not necessarily limited to oxides.

Therefore, the use of the term "MOS" is not necessarily limited to a metal-oxide-semiconductor laminated structure, and the present specification, too, does not assume such a limitation. In other words, in consideration of common general technical knowledge, "MOS" herein has a meaning not only as an abbreviation derived from its etymology, but also broadly including conductor-insulator-semiconductor laminated structures.

Some embodiments will now be explained with reference to some drawings. In the following description, the parts that are the same or corresponding among the drawings are given the same reference numerals, and the description thereof will not be repeated.

In first to fourth embodiments explained below, as an example of a silicon carbide semiconductor device, a vertical n-type MOSFET the main current of which flows in a thickness direction of a substrate will be explained.

First Embodiment

Device Configuration

FIG. 1 is a plan view schematically illustrating a top surface configuration of an n-type silicon carbide MOSFET 100 according to a first embodiment of the present disclosure. Note that the top surface configuration of FIG. 1 is common in all the embodiments.

In addition, although the n-type silicon carbide MOSFET 100 is explained to have a planar gate structure, an application according to the present disclosure is not limited to a planar gate structure, and is also applicable to a trench gate structure. In addition, the present invention is not limited to a MOSFET as long as it has a MOS structure, and may also be applied to an IGBT.

As illustrated in FIG. 1, the n-type silicon carbide MOSFET 100 has a quadrangular outer shape, and a gate wiring 103 is provided along its outer edge. In addition, a cell arrangement region CR where a unit cell UC, which is the smallest unit of the MOS structure, is arranged in plurality is provided at the center, on a main surface of the n-type silicon carbide MOSFET 100.

The shape of the cell arrangement region CR in a planar view delineates a quadrangle, a part of which is recessed inwardly at the center along one side, and a gate pad 102 is provided in a manner extending into the inwardly recessed part of the cell arrangement region CR. The cell arrangement region CR is spaced from the gate pad 102 and the gate wiring 103.

A gate voltage is applied to the gate pad 102 from an external control circuit (not illustrated), and the applied gate voltage is supplied to gate electrodes (not illustrated) of the unit cells UC, via the gate wiring 103.

In the cell arrangement region CR, a source pad 101 (source electrode) for connecting the sources of the respective unit cells in parallel is provided, and the source pad 101 is provided in a manner covering substantially the entire surface of the cell arrangement region CR. Although a unit cell UC is illustrated in the source pad 101 in FIG. 1, this position is for convenience.

Figure 2:
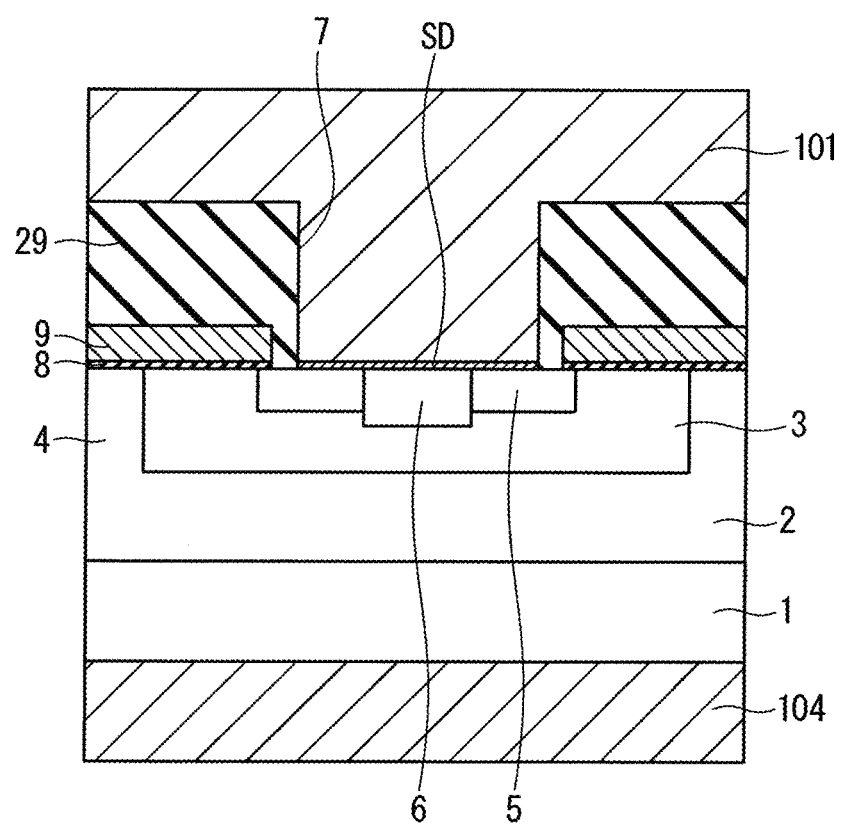
FIG. 2 is a cross-sectional view illustrating a configuration of the silicon carbide semiconductor device according to the first embodiment.

FIG. 2 is a cross-sectional view across the line C-C in FIG. 1, viewed in the direction of arrows, and is a cross-sectional view schematically illustrating the configuration of the unit cell UC. As illustrated in FIG. 2, the n-type silicon carbide MOSFET 100 is provided on a silicon carbide substrate 1 that contains an n-type (first conductivity type) impurity at a relatively high concentration.

A drift layer 2 (semiconductor layer) that is a semiconductor layer containing a relatively low concentration of the n-type impurity is provided on a first main surface of the silicon carbide substrate 1. The drift layer 2 is, for example, an epitaxially grown layer formed by epitaxy.

A first well region 3 containing a p-type (second conductivity type) impurity is provided on an upper layer portion of the drift layer 2, and a first well contact region 6 containing a relatively high concentration of a p-type impurity is provided selectively on an upper layer portion the first well region 3. A first source region 5 (first impurity region) containing a relatively high concentration of an n-type impurity is provided in contact with two side surfaces of the first well contact region 6. The drift layer 2 between the adjacent first well regions 3 forms a junction-field-effect transistor (JFET) region 4.

The depth of the first well region 3 from the topmost surface of the drift layer 2 is deeper than the depth of the first source region 5 from the topmost surface of the drift layer 2. The depth of the first well contact region 6 from the topmost surface of the drift layer 2 is equal to or deeper than the depth of the first source region 5 from the topmost surface of the drift layer 2, but does not extend beyond the first well region 3.

A gate insulating film 8 is formed on the drift layer 2, and a gate electrode 9 is provided on the gate insulating film 8.

The gate electrode 9 is provided on the JFET region 4, the first well region 3, and on the end portion of the first source region 5.

Although an interlayer insulating film 29 is provided on the drift layer 2 including the gate electrode 9, a first source contact 7 (first contact) is provided in contact with the first well contact region 6 and a part of the first source region 5. A silicide film SD made of nickel silicide, for example, is provided on the bottom of the first source contact 7, and the first well contact region 6 and a part of the first source region 5 are covered by the silicide film SD. The first well contact region 6 and the first source region 5 are electrically connected to the source pad 101 via the silicide film SD and the first source contact 7. A drain electrode 104 is provided on a second main surface of the silicon carbide substrate 1, the second main surface being on the opposite side of the first main surface.

The silicide film SD is not limited to nickel silicide, and aluminum silicide or titanium silicide may also be used. The first source contact 7 may be formed by embedding a metal that is a material of the source pad 101, e.g., nickel, aluminum, or titanium, inside the contact hole, at the time when the source pad 101 is formed.

The drift layer 2 preferably has an impurity concentration of $1.0 \times 10^{14}$ cm$^{-3}$ or higher and $1.0 \times 10^{17}$ cm$^{-3}$ or lower. The impurity concentration of the JFET region 4 is preferably lower than the impurity concentration of the first well region 3. This is to allow a depletion layer formed by a pn junction between the JFET region 4 and the first well region 3 to extend more toward the JFET region 4. The impurity concentration of the first well region 3 is preferably $1.0 \times 10^{16}$ cm$^{-3}$ or higher and $1.0 \times 10^{20}$ cm$^{-3}$ or lower. The impurity concentration of the first source region 5 is preferably $1.0 \times 10^{17}$ cm$^{-3}$ or higher and $1.0 \times 10^{21}$ cm$^{-3}$ or lower. The impurity concentration of the first well contact region 6 is preferably $1.0 \times 10^{18}$ cm$^{-3}$ or higher and $1.0 \times 10^{22}$ cm$^{-3}$ or lower.

Figure 3:
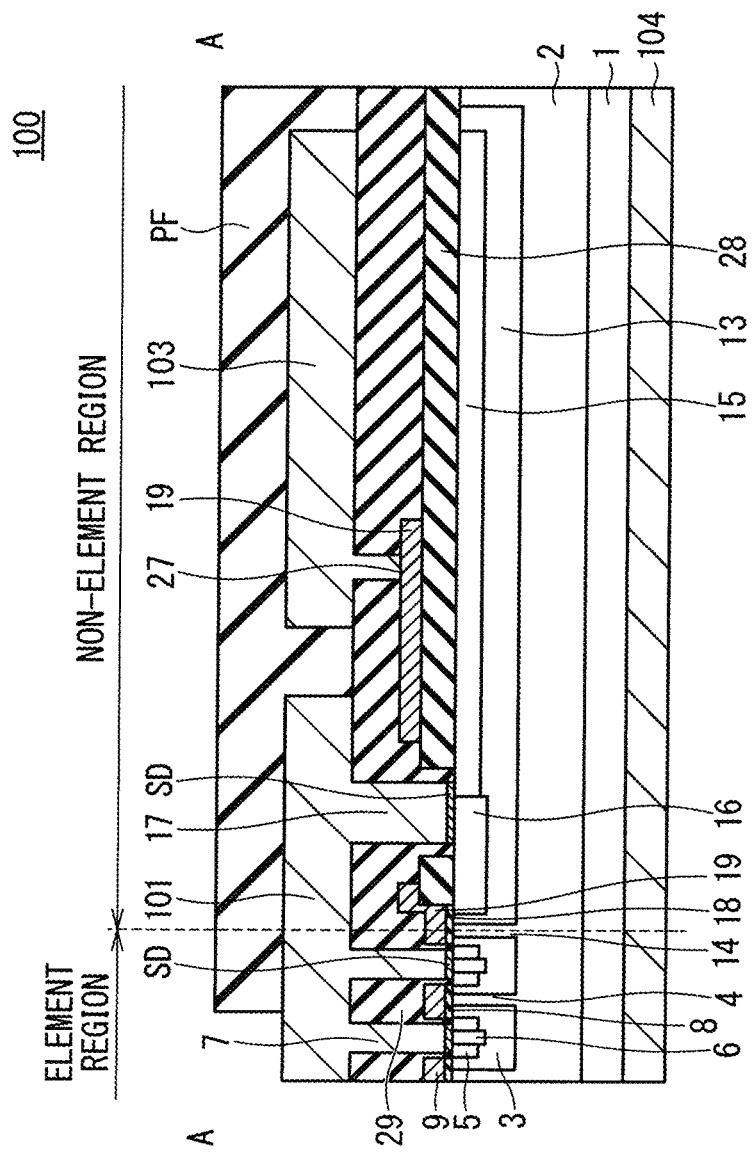
FIG. 3 is a cross-sectional view illustrating a configuration of the silicon carbide semiconductor device according to the first embodiment.

FIG. 3 is a cross-sectional view across the line A-A in FIG. 1, viewed in the direction of arrows, and is a cross-sectional view schematically illustrating a configuration of the cell arrangement region CR, that is, an element region where semiconductor elements are provided, and a non-element region where no semiconductor elements are provided.

As illustrated in FIG. 3, the configuration of the element region is the same as the configuration illustrated in FIG. 2. In the non-element region, a second well region 13 containing a p-type impurity is provided as an upper layer portion of the drift layer 2, and either a second source region 15 (second impurity region) containing a relatively high concentration of the n-type impurity and a p-type second well contact region 16 that is in contact with the second source region 15 and that has an impurity concentration higher than that of the second well region 13 is provided selectively, as an upper layer portion of the second well region 13. The second source region 15 is formed in such a size that the most of the upper layer portion of the second well region 13 is occupied thereby in the planar direction. In the remaining upper layer portion of the second well region 13, the second well contact region 16 is provided on the side closer to the element region than the second source region 15, and is provided in a manner extending from the pn junction under the second source contact 17 (second contact) to below a boundary gate electrode 19.

Among a plurality of the first well regions 3 in the element region, the drift layer 2 between a first well region 3 adjacent to a second well region 13 and the second well region 13 provides an outermost JFET region 14, and the boundary between the element region and the non-element region is defined as the outermost JFET region 14.

In the non-element region, a field insulating film 28 is formed on the second well region 13, and the second source contact 17 that is electrically connected to the second source region 15 and the second well contact region 16 is provided in a manner passed through the field insulating film 28. In addition, provided on the second well region 13 and the first well region 3 is a boundary gate electrode 19, with a boundary gate insulating film 18 therebetween, on the boundary between the element region and the non-element region. The boundary gate electrode 19 extends onto the field insulating film 28 above the second source region 15. In FIG. 3, the gate electrode 9 and the boundary gate electrode 19 in the element region are illustrated as discontinuous, but are continuous in a plan view.

The interlayer insulating film 29 is provided on the drift layer 2 including the gate electrode 9 and the boundary gate electrode 19, and the interlayer insulating film 29 electrically isolates the gate electrode 9 and the boundary gate electrode 19 from the source pad 101. The second source contact 17 is also passed through the interlayer insulating film 29, and is electrically connected to the second source region 15 and the second well contact region 16. In addition, a gate contact 27 is provided in a manner passed through the interlayer insulating film 29 and reaching the boundary gate electrode 19 on the field insulating film 28, and the boundary gate electrode 19 and the gate electrode 9 are electrically connected to the gate wiring 103 via the gate contact 27.

A protection film PF is provided on the gate wiring 103 and the source pad 101 in the non-element region, and on a part of the source pad 101 in the element region. The protection film PF is provided as an insulating film.

A silicide film SD made of, for example, nickel silicide is provided on the bottom of the second source contact 17, and the silicide film SD covers a part of the second source region 15 and of the second well contact region 16. The second well contact region 16 and the second source region 15 are electrically connected to the source pad 101 via the silicide film SD and the second source contact 17. The silicide film SD is not limited to nickel silicide, and aluminum silicide or titanium silicide may also be used. The second source contact 17 may be formed by embedding a metal that is a material of the source pad 101, e.g., nickel, aluminum, or titanium, inside the contact hole, at the time when the source pad 101 is formed.

The impurity concentration of the second well region 13 is preferably $1.0 \times 10^{16}$ cm$^{-3}$ or higher and $1.0 \times 10^{20}$ cm$^{-3}$ or lower. The impurity concentration of the second source region 15 is preferably $1.0 \times 10^{17}$ cm$^{-3}$ or higher and $1.0 \times 10^{21}$ cm$^{-3}$ or lower. The impurity concentration of the second well contact region 16 is preferably $1.0 \times 10^{18}$ cm$^{-3}$ or higher and $1.0 \times 10^{22}$ cm$^{-3}$ or lower. By using such concentration ranges, it is possible to achieve a silicon carbide semiconductor device having a desired rating.

In addition, the length by which the second well contact region 16 extends from the pn junction under the second source contact 17 onto the side of the element region is preferably 1.0 µm or more and 100 µm or less. By setting the length to such a range, it is possible to ensure a margin in the designing of the dimensions of the silicon carbide semiconductor device.

Figure 4:
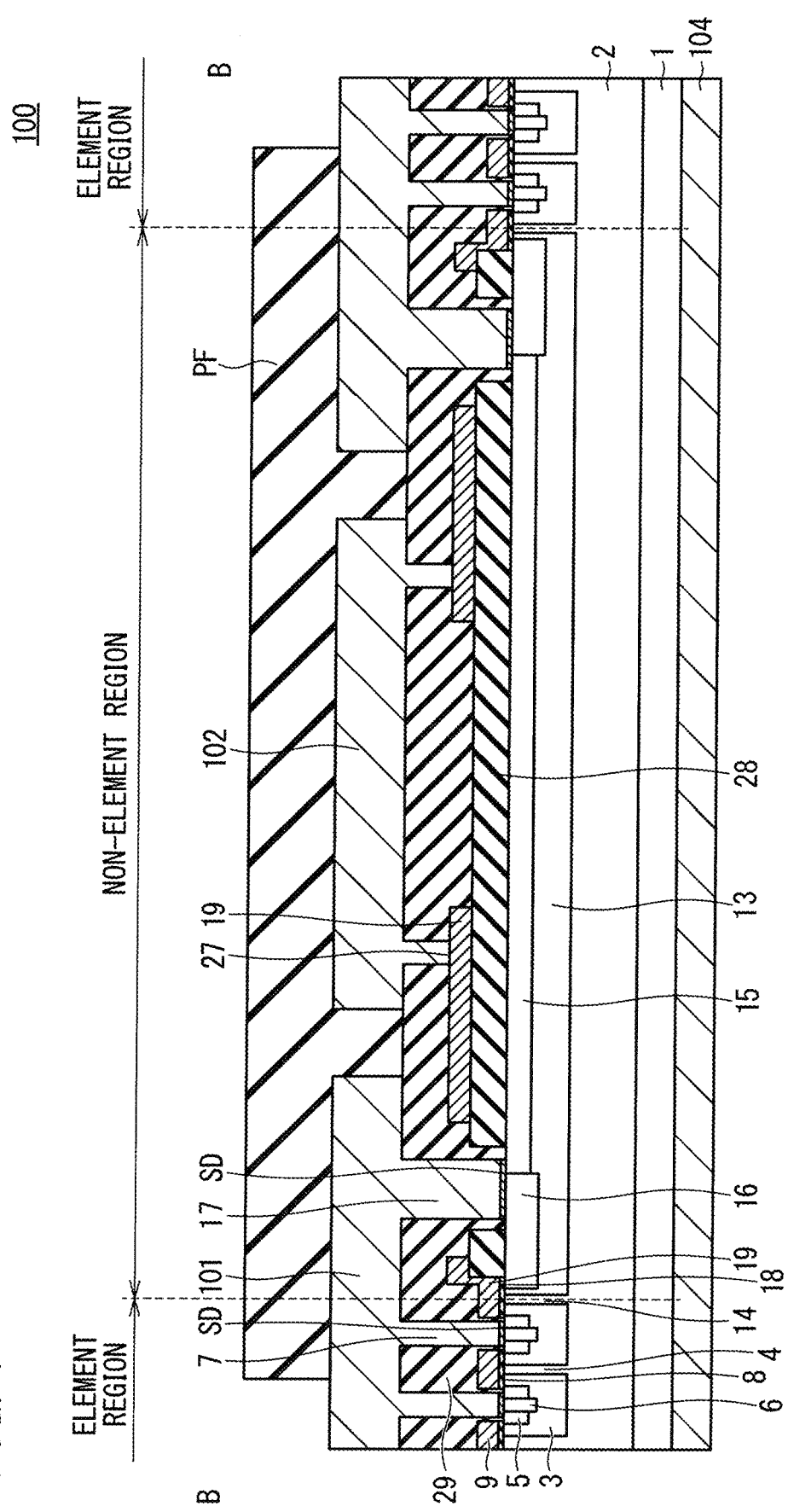
FIG. 4 is a cross-sectional view illustrating a configuration of the silicon carbide semiconductor device according to the first embodiment.

FIG. 4 is a cross-sectional view across the line B-B in FIG. 1, viewed in the direction of arrows, and is a cross-sectional view schematically illustrating a configuration of the element region and a non-element region that is a region where the gate pad 102 is formed. As illustrated in FIG. 4, the configuration of the element region and the non-element region is the same as the configuration illustrated in FIG. 3.

Figure 5:
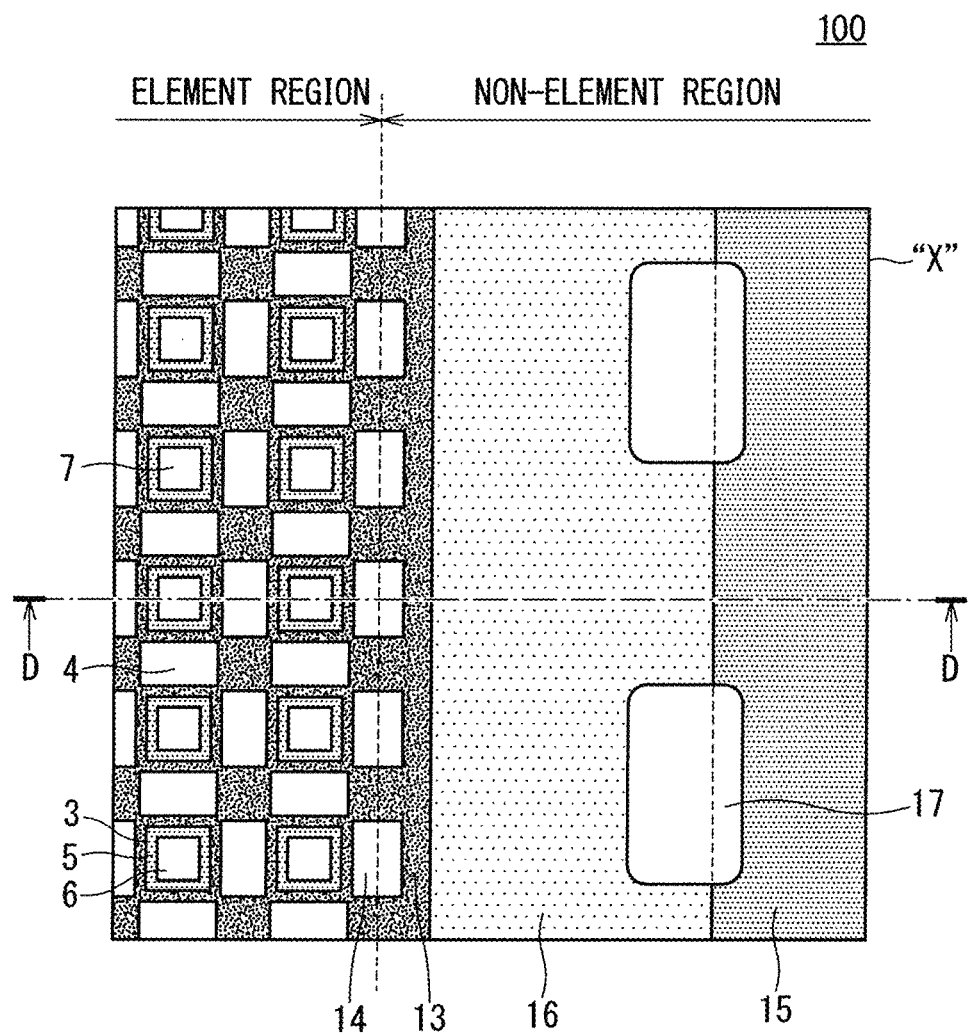
FIG. 5 is a partial plan view illustrating a configuration of the silicon carbide semiconductor device according to the first embodiment.

FIG. 5 is a plan view schematically illustrating a configuration of the element region and the non-element region in the area X illustrated in FIG. 1. For the sake of convenience, the insulating film and the electrode on the drift layer 2 are not illustrated, and only the configurations of the upper layer portions of the drift layer 2 are illustrated.

As illustrated in FIG. 5, the unit cells UC in the element region have square shapes, respectively, in a plan view and are arranged in a matrix shape, but this is an example, and the shape is not limited to a square, and may be a rectangle or a polygon.

In each of the unit cells UC having a square shape in a plan view, the first source region 5 surrounds the outer end portion of the first well contact region 6 having a square outer shape, and the outside thereof is surrounded by the first well region 3.

The JFET region 4 is formed between the unit cells UC. The first well region 3 connects corners of the unit cells UC that are adjacent to each other in the diagonal direction.

In the non-element region, the second well contact region 16 is provided in a manner continuous to the second well region 13, and the second source region 15 is provided in a manner continuous to the second well contact region 16.

The second well contact region 16 is formed continuously in a manner extending under the plurality of second source contacts 17 in a plan view, and similarly, the second source region 15 is continuously provided in a manner extending under the plurality of second source contacts 17 in a plan view.

Figure 6:
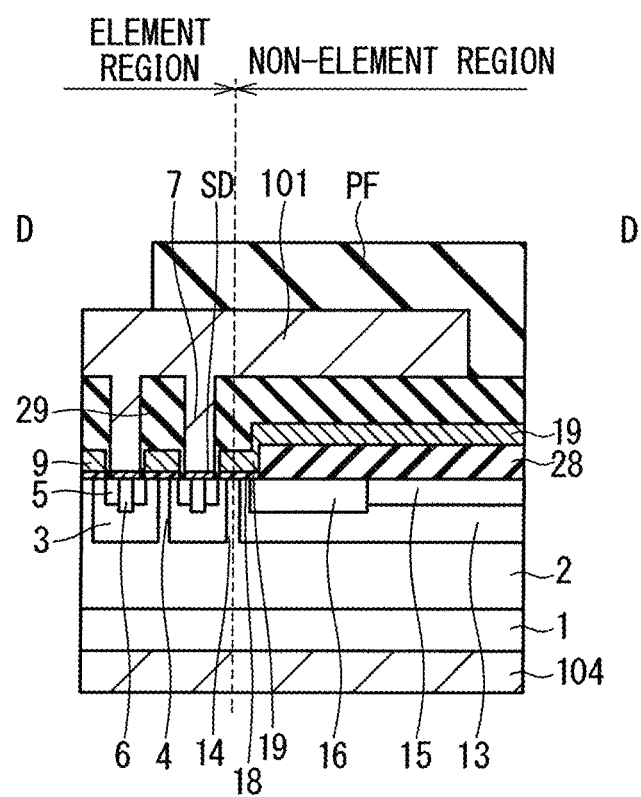
FIG. 6 is a cross-sectional view illustrating a configuration of the silicon carbide semiconductor device according to the first embodiment.

FIG. 6 is a cross-sectional view across the line D-D in FIG. 5, viewed in the direction of arrows, and is a cross-sectional view schematically illustrating a configuration of the element region and the non-element region. As illustrated in FIG. 5, the second source contact 17 is provided in plurality, in a manner separated from one another, and the boundary gate electrode 19 is provided continuously across the element region and the non-element region, between the plurality of second source contacts 17, as illustrated in FIG. 6, so that the gate signal applied to the gate wiring 103 can be transmitted to the gate electrodes 9 in the element region via the gate contact 27.

Manufacturing Method

An example of a method for manufacturing the n-type silicon carbide MOSFET 100 will be now explained with reference to FIGS. 7 to 18 that are cross-sectional views sequentially illustrating the manufacturing process.

Figure 7:
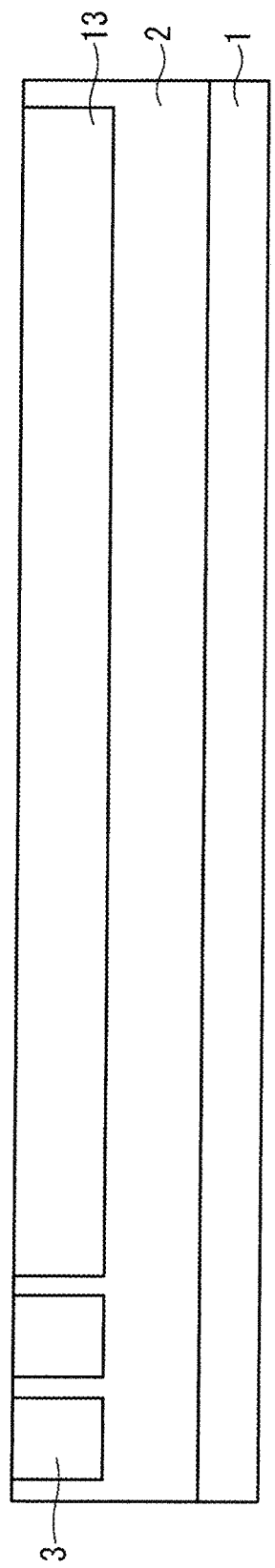
FIG. 7 is a cross-sectional view for explaining a method of manufacturing the silicon carbide semiconductor device according to the first embodiment.

To begin with, as illustrated in FIG. 7, the n-type drift layer 2 made of silicon carbide is epitaxially grown by a chemical vapor deposition (CVD) on a first main surface having a (0001) plane orientation of the n-type silicon carbide substrate 1 having a 4H polytype and low resistance. The n-type impurity concentration of the drift layer 2 is set to, for example, $1\times10^{14}$ cm$^{-3}$ to $1\times10^{17}$ cm$^{-3}$, and the thickness of the drift layer 2 is set to, for example, 5 µm to 50 µm.

An implantation mask (not illustrated) is then formed on the drift layer 2 using a photoresist or the like, and Al (aluminum) that is a p-type impurity is ion-implanted to form a p-type first well region 3 and second well region 13 in the upper layer portions of the drift layer 2. The Al ion implantation depth is set to a depth not exceeding the thickness of the drift layer 2, e.g., 0.5 µm to 3 µm. The concentration of Al, which is the ion-implanted impurity, is set to, for example, $1\times10^{16}$ cm$^{-3}$ to $1\times10^{20}$ cm$^{-3}$, and is set higher than the n-type impurity concentration in the drift layer 2. After the Al ion implantation, the implantation mask is removed. At this time, it is possible to form the first well region 3 and the second well region 13 in the same step, but also possible to form in separate steps.

Figure 8:
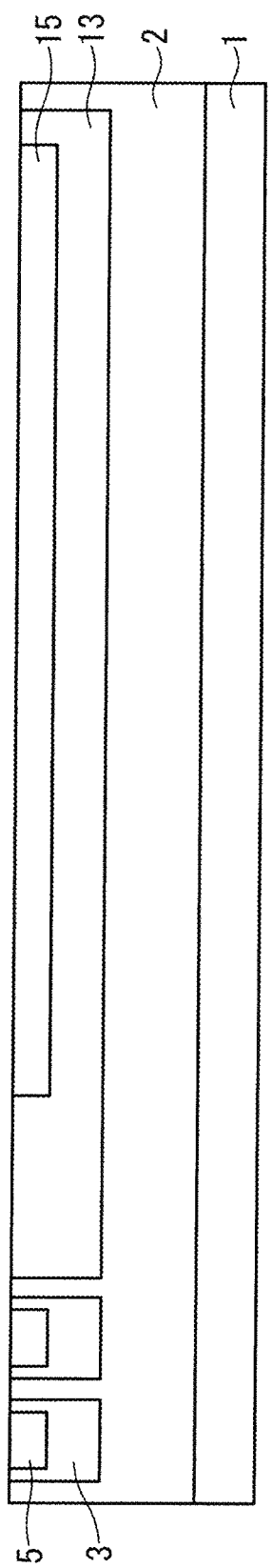
FIG. 8 is a cross-sectional view for explaining the method of manufacturing the silicon carbide semiconductor device according to the first embodiment.

In the step illustrated in FIG. 8, an implantation mask (not illustrated) is then formed on the drift layer 2 with a photoresist or the like, and N (nitrogen) that is an n-type impurity is ion-implanted to form the n-type first source region 5 as an upper layer portion of the first well region 3, and to form the second source region 15 as an upper layer portion of the second well region 13. The N ion implantation depth is set shallower than the thicknesses of the first well region 3 and the second well region 13. The impurity concentration of ion-implanted N is, for example, $1\times10^{17}$ cm$^{-3}$ to $1\times10^{21}$ cm$^{-3}$, and is set higher than the p-type impurity concentration of the first well region 3 and the second well region 13, respectively. After N is ion-implanted, the implantation mask is removed. At this time, the first source region 5 and the second source region 15 are formed in the same process, but it is possible to form these contact regions in separate processes.

Figure 9:
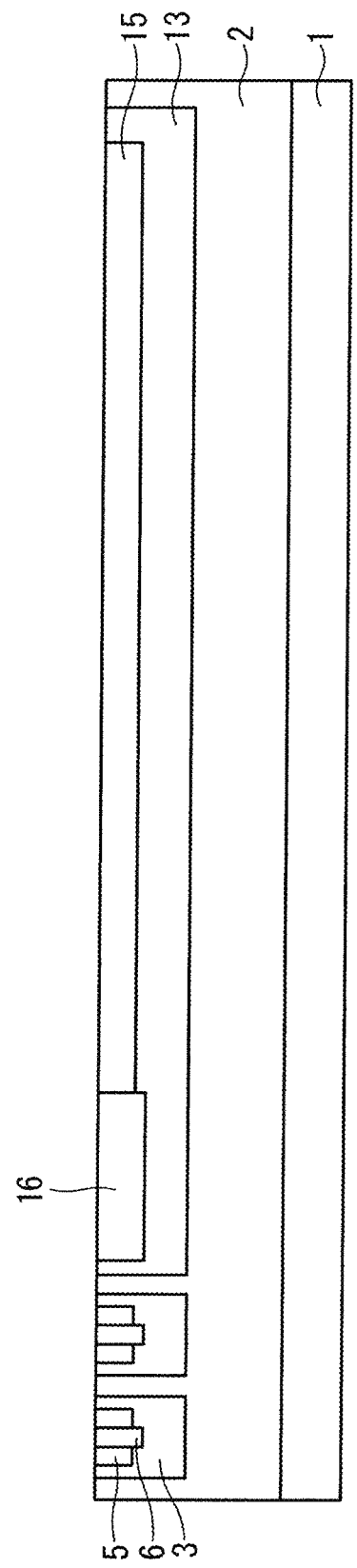
FIG. 9 is a cross-sectional view for explaining the method of manufacturing the silicon carbide semiconductor device according to the first embodiment.

In the step illustrated in FIG. 9, an implantation mask (not illustrated) is then formed on the drift layer 2 with a photoresist or the like, and Al that is a p-type impurity is ion-implanted to form a p-type first well contact region 6 as an upper layer portion of the first well region 3, and to form a second well contact region 16 as an upper layer portion of the second well region 13. The first well contact region 6 is formed from the topmost surface of the first source region 5 to a depth at which the first well contact region 6 is electrically connected to the first well region 3. The second well contact region 16 is formed from the topmost surface of the second source region 15 to a depth at which the second well contact region 16 is electrically connected to the second well region 13. The first well contact region 6 is provided to achieve good electrical contact between the first well region 3 and the first source contact 7 for electrically connecting the source pad 101 to the first well region 3.

The p-type impurity concentrations of the first well contact region 6 and the second well contact region 16 are preferably set higher than the p-type impurity concentrations of the first well region 3 and the second well region 13, respectively. After the Al ion implantation, the implantation mask is removed. At this time, the first well contact region 6 and the second well contact region 16 are formed in the same process, but it is possible to form these contact regions in separate processes.

Figure 10:
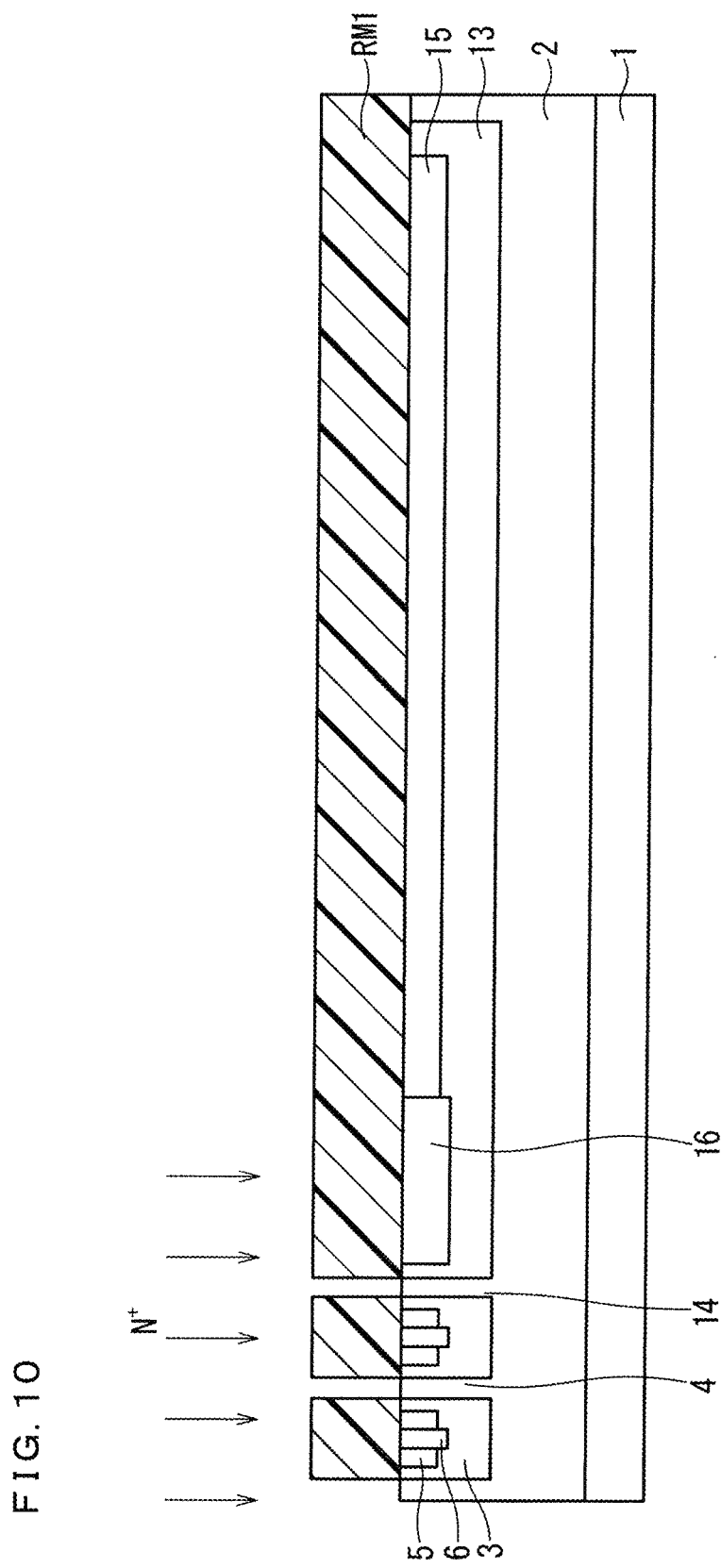
FIG. 10 is a cross-sectional view for explaining the method of manufacturing the silicon carbide semiconductor device according to the first embodiment.

In the step illustrated in FIG. 10, an implantation mask RM1 is then formed on the drift layer 2 using a photoresist or the like, and N that is an n-type impurity is ion-implanted to form a high-concentration region having a high n-type impurity concentration in the JFET region 4 and the outermost JFET region 14. In this manner, the n-type impurity concentration of the JFET region 4 and the outermost JFET region 14 are set higher than the n-type impurity concentration of the drift layer 2. It is, however, preferable for the concentration of N, which is the ion-implanted impurity, to be lower than the p-type impurity concentration of the first well region 3. This is because the impurity concentrations of the JFET region 4 and the outermost JFET region 14 are set relatively lower with respect to that of the first well region 3, so that a depletion layer extends toward the JFET region 4 and the outermost JFET region 14 when a reverse bias is applied to the pn junction formed between the first well region 3, and the JFET region 4 and the outermost JFET region 14.

After N is ion-implanted, the implantation mask RM1 is removed. In the present embodiment, as an example, the JFET region 4 and the outermost JFET region 14 having impurity concentrations higher than that of the drift layer 2 are formed by n-type impurity implantation. However, n-type impurity implantation is not necessarily required, and the impurity implantation may also be a p-type impurity implantation. The impurity concentrations of the JFET region 4 and the outermost JFET region 14 may be the same as the impurity concentration of the drift layer 2.

Figure 11:
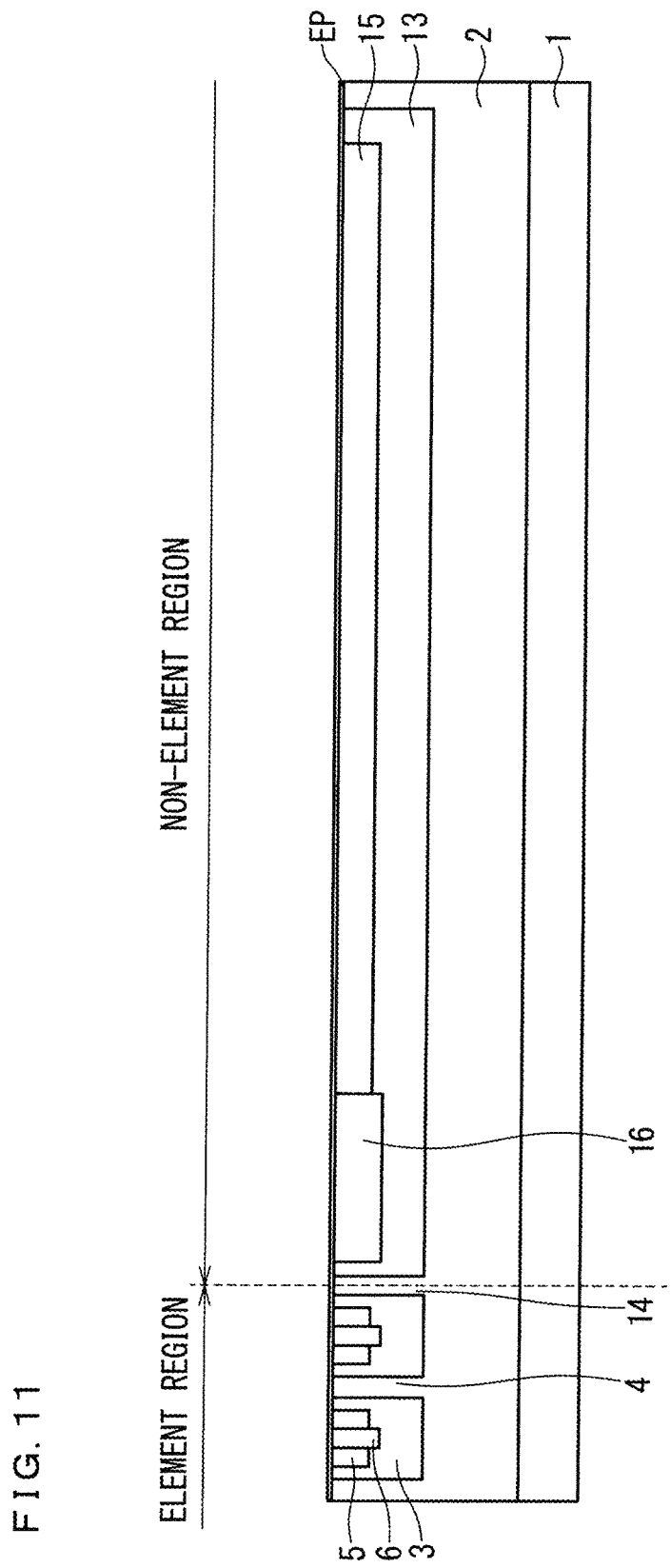
FIG. 11 is a cross-sectional view for explaining the method of manufacturing the silicon carbide semiconductor device according to the first embodiment.

In the step illustrated in FIG. 11, an n-type or p-type epitaxial layer EP is epitaxially grown on the drift layer 2. The thickness of the epitaxial layer EP may be 10 nm to 500 nm. Although the epitaxial layer EP is provided as an epitaxial channel layer internal of which a channel is formed, but this configuration is not essential, and illustration thereof is omitted in FIGS. 2 to 4, and drawings described in the description below.

Figure 12:
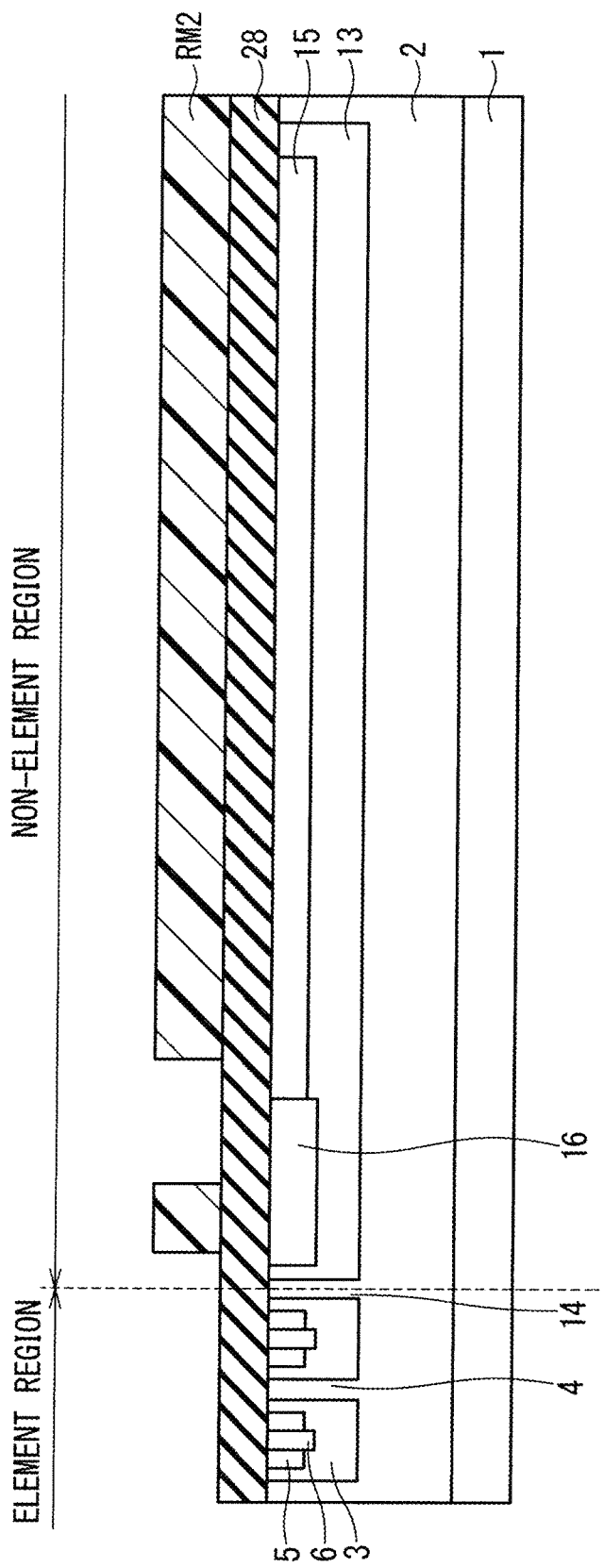
FIG. 12 is a cross-sectional view for explaining the method of manufacturing the silicon carbide semiconductor device according to the first embodiment.

In the step illustrated in FIG. 12, a field insulating film 28 is then formed on the drift layer 2 by a reduced-pressure CVD, and an etching mask RM2 is formed on the field insulating film 28 using a photoresist or the like. The field insulating film 28 is then partially removed by etching. The portions to be removed are portions where the gate insulating film 8 and the boundary gate insulating film 18 are to be formed subsequently. The etching mask RM2 is then removed.

Figure 13:
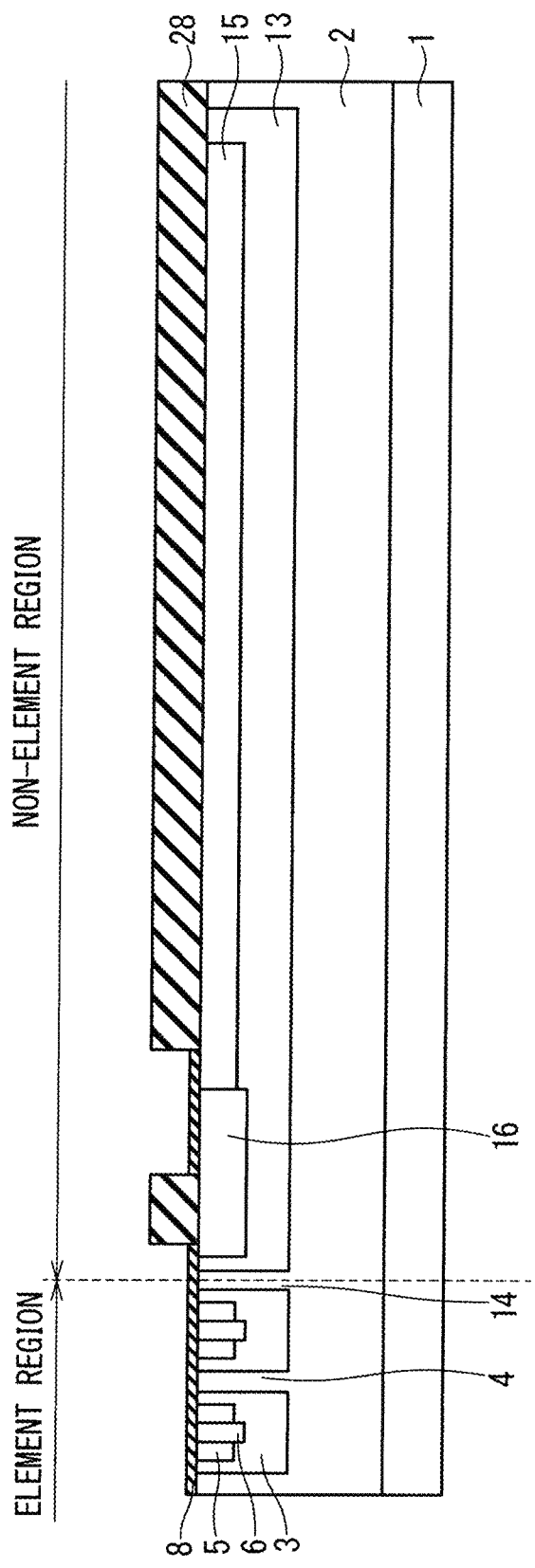
FIG. 13 is a cross-sectional view for explaining the method of manufacturing the silicon carbide semiconductor device according to the first embodiment.

In the step illustrated in FIG. 13, the surface of the drift layer 2 is then thermally oxidized to form the gate insulating film 8 at a desired thickness.

Figure 14:
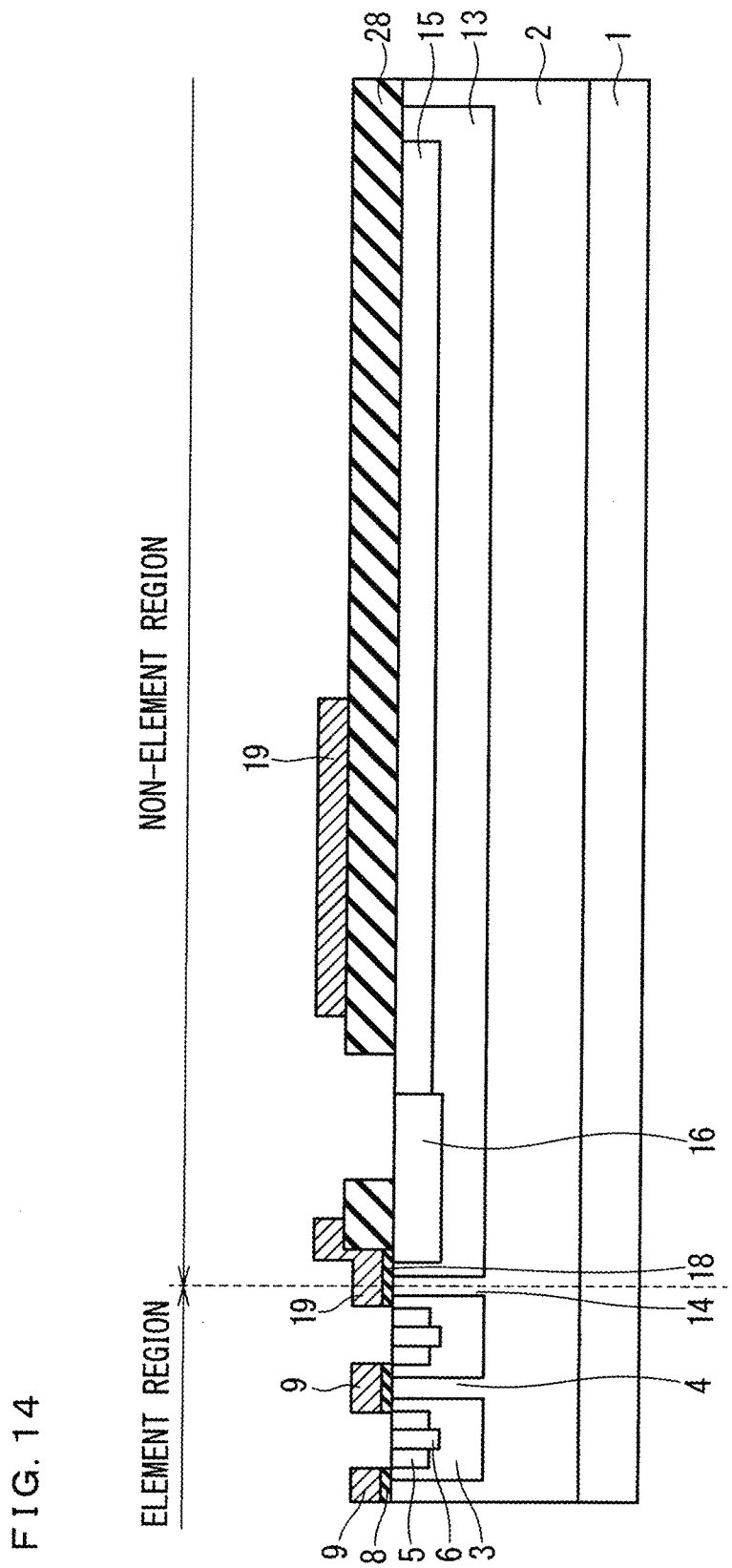
FIG. 14 is a cross-sectional view for explaining the method of manufacturing the silicon carbide semiconductor device according to the first embodiment.

In the step illustrated in FIG. 14, a conductive polycrystalline silicon (polysilicon) film is then formed on the gate insulating film 8 by a reduced-pressure CVD, and patterned by etching to form the gate electrode 9 and the boundary gate electrode 19. In addition, the gate insulating film 8 not covered with the gate electrode 9 and the boundary gate electrode 19 is removed by etching, for example. At this time, the gate insulating film 8 below the boundary gate electrode 19 becomes the boundary gate insulating film 18.

Figure 15:
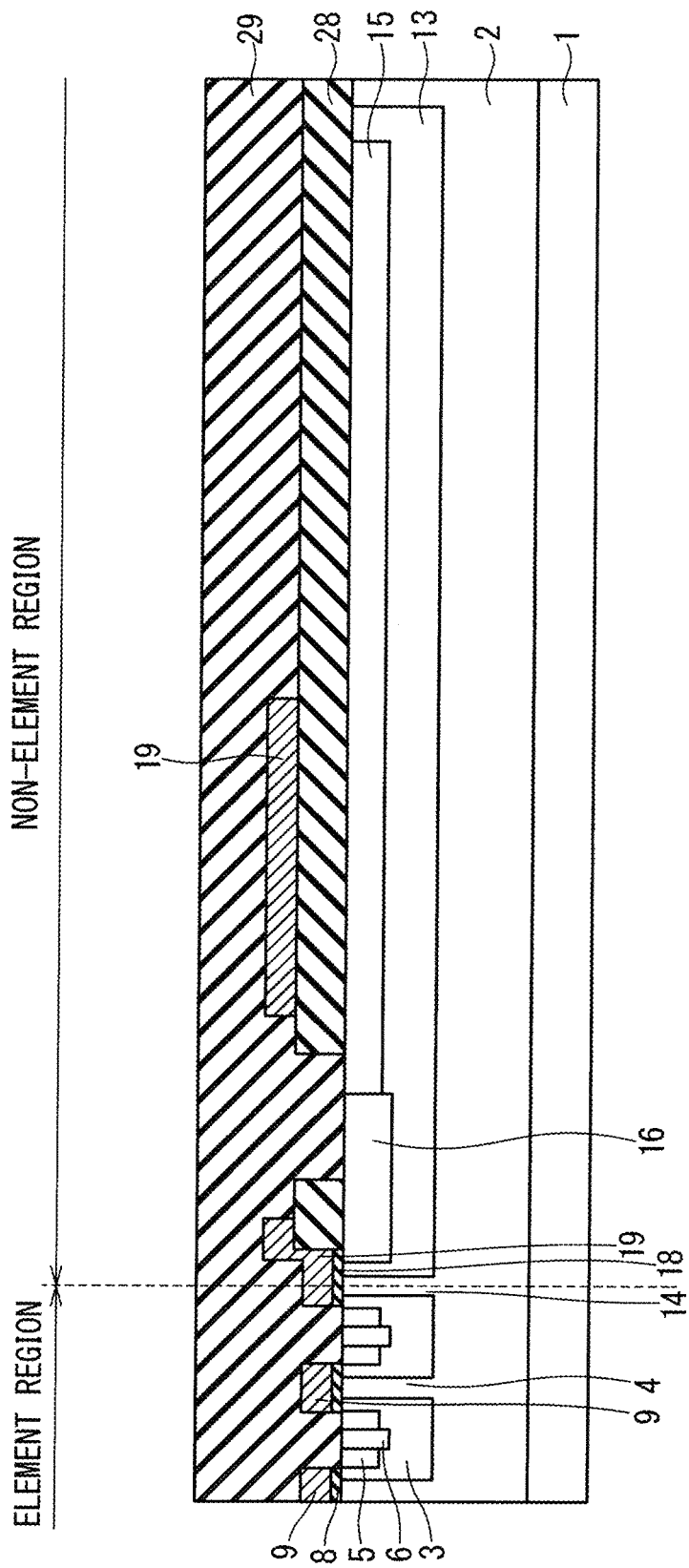
FIG. 15 is a cross-sectional view for explaining the method of manufacturing the silicon carbide semiconductor device according to the first embodiment.

In the step illustrated in FIG. 15, an interlayer insulating film 29 is then formed on the drift layer 2 including the gate electrode 9 and the boundary gate electrode 19, by a reduced-pressure CVD.

Figure 16:
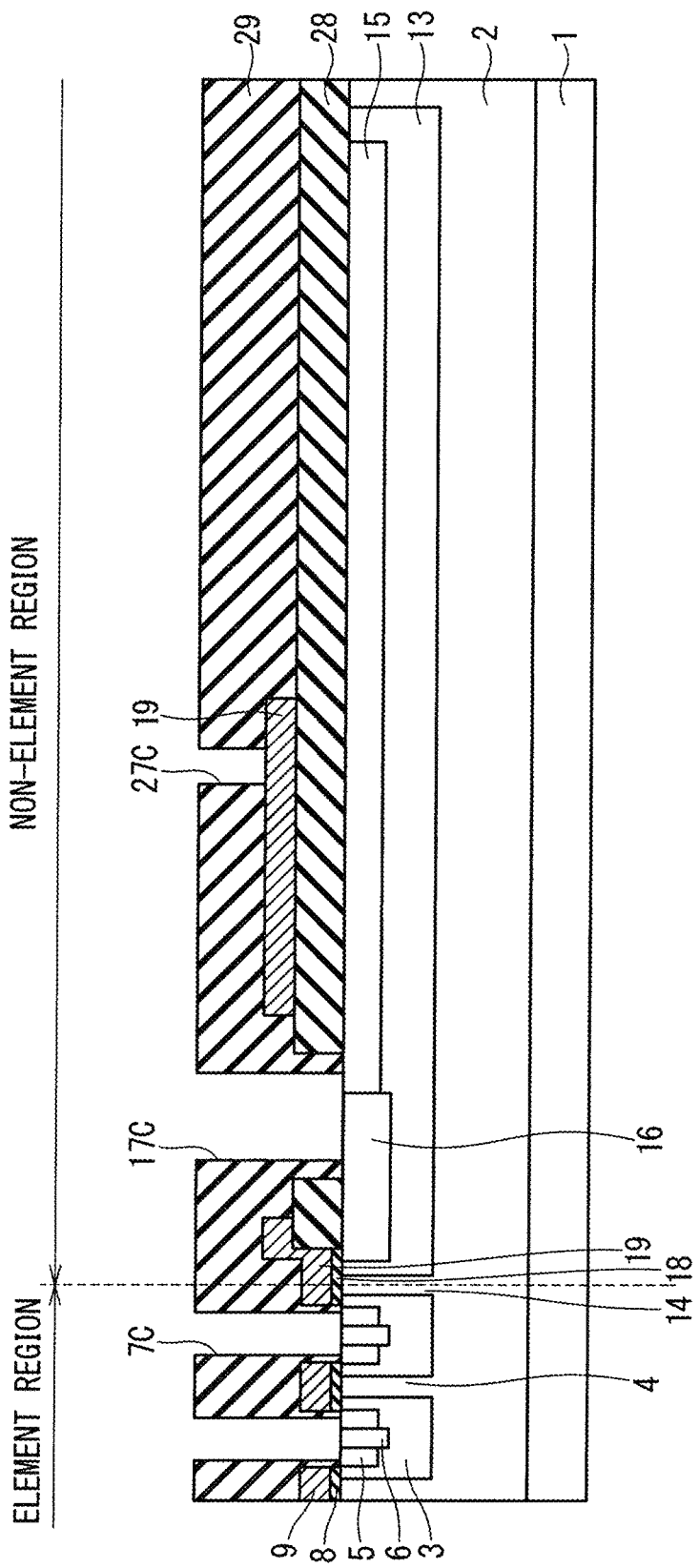
FIG. 16 is a cross-sectional view for explaining the method of manufacturing the silicon carbide semiconductor device according to the first embodiment.

In the step illustrated in FIG. 16, a first source contact hole 7C passed through the interlayer insulating film 29 and the gate insulating film 8 and reaching the first well contact region 6 and the first source region 5, and a second source contact hole 17C passed through the interlayer insulating film 29 and the gate insulating film 8 and reaching the second well contact region 16 and the second source region 15 are then formed. A gate contact hole 27C passed through the interlayer insulating film 29 and reaching the gate electrode 9 is also formed.

Figure 17:
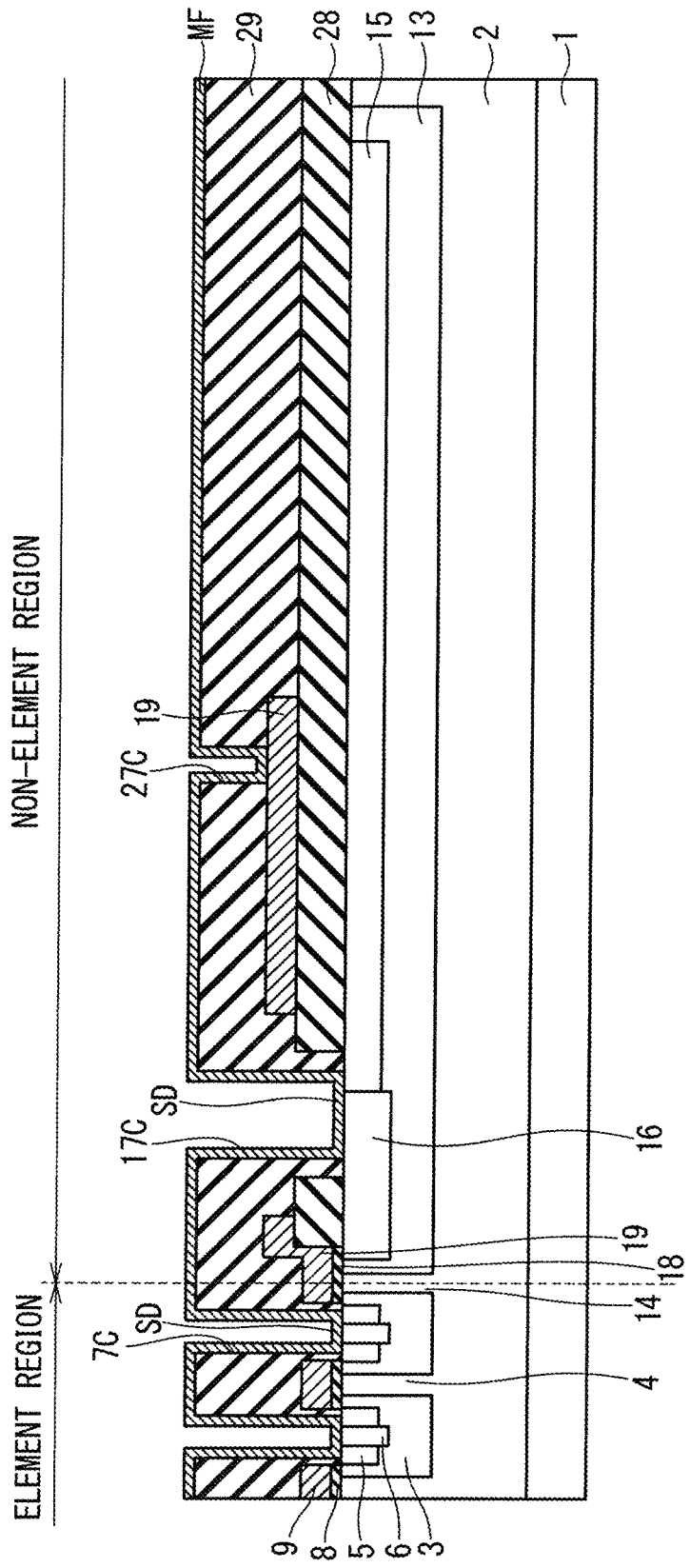
FIG. 17 is a cross-sectional view for explaining the method of manufacturing the silicon carbide semiconductor device according to the first embodiment.

In the step illustrated in FIG. 17, a metal film MF containing, for example, nickel (Ni) as a main component is then formed on the interlayer insulating film 29 by sputtering, for example, and a heat treatment is then applied at a temperature of 600° C. or higher and 1100° C. or lower to cause a reaction between the metal film MF containing Ni as a main component and silicon carbide, to form a silicide film SD. The metal film MF remaining on the interlayer insulating film 29, other than the silicide film SD, is then removed by wet etching. With this silicide film SD, ohmic contact is formed across the bottom surfaces of the first source contact hole 7C and the second source contact hole 17C.

Figure 18:
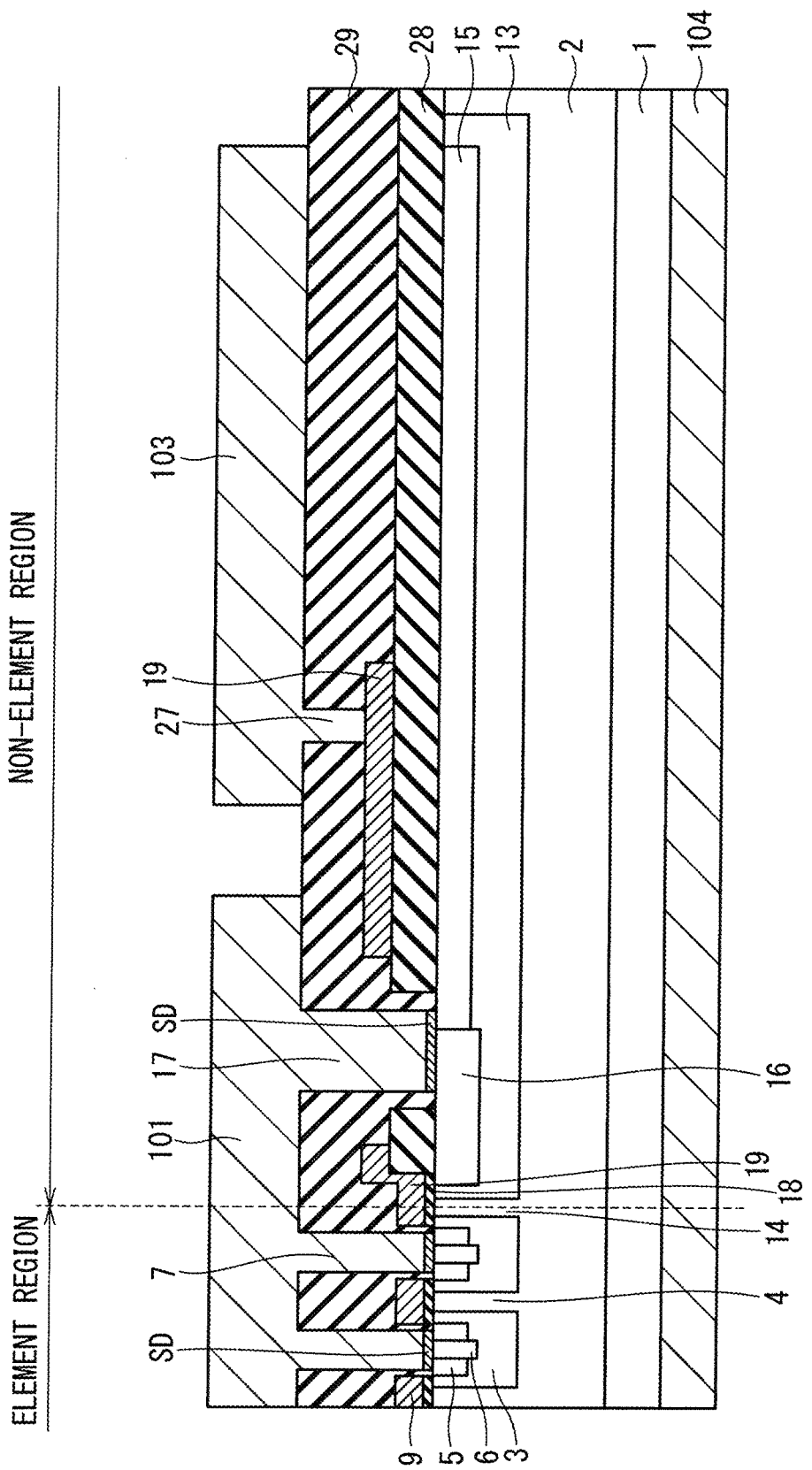
FIG. 18 is a cross-sectional view for explaining the method of manufacturing the silicon carbide semiconductor device according to the first embodiment.

In the step illustrated in FIG. 18, a metal film containing Ni as a main component is then formed on the second main surface (rear surface) of the silicon carbide substrate 1, and heat treatment is applied to form a rear surface contact (not illustrated) on the rear surface of the silicon carbide substrate 1. A metal layer, such as a layer of Al, is then formed on the front surface of the silicon carbide substrate 1 on which the interlayer insulating film 29 has been formed by sputtering or vapor deposition, and is applied with photolithography into a predetermined shape. In this manner, the first source contact 7, the second source contact 17, and the gate contact 27 are formed, and the source pad 101 connected to the first source contact 7 and the second source contact 17, and the gate wiring 103 connected to the gate contact 27 are formed. At this time, the gate pad 102 (FIG. 4) connected to the gate wiring 103 is also formed. A metal layer of Al or the like is formed on the rear surface contact of the rear surface of the silicon carbide substrate 1 by sputtering or vapor deposition, so that a drain electrode 104 is formed thereby. The protection film PF (FIG. 3) is then formed as an insulating film or the like, in a manner covering the gate wiring 103 and the source pad 101 in the non-element region and a part of the upper portion of the source pad 101 in the element region. A finished product of the n-type silicon carbide MOSFET 100 is thus achieved.

Advantageous Effects

Advantageous effects achieved by the configuration of the n-type silicon carbide MOSFET 100 according to the first embodiment will now be explained. In the n-type silicon carbide MOSFET 100, for example, as illustrated in FIG. 3, the second well contact region 16 is provided in a manner extending from the pn junction under the second source contact 17 toward the element region, and the second source region 15 is provided in a manner extending from the pn junction under the second source contact 17 toward the non-element region.

In addition, as illustrated in FIG. 5, the second well contact region 16 is formed continuously in a manner extending under the plurality of second source contacts 17 in a plan view, and similarly, the second source region 15 is continuously provided in a manner extending under the plurality of second source contacts 17 in a plan view. Therefore, when the n-type silicon carbide MOSFET 100 is switched from the off state to the on state, the displacement current flowing from the second source contact 17 can be dispersed, and any concentration of the displacement current can be avoided.

The second source contact 17 is made using a metal such as nickel, aluminum, or titanium, and a silicide film SD made of silicon carbide and the metal is formed at the bottom of the second source contact 17. As a result, good ohmic contact is formed across both of the second source region 15 and the second well contact region 16.

At this time, when the part where the second source contact 17 is brought into ohmic contact with the p-type second well contact region 16 and the n-type second source region 15 is formed in the same step, the contact resistance (differential contact resistance) per unit area of the second source contact 17 and the second well contact region 16 becomes greater than the differential contact resistance of the second source contact 17 and the second source region 15.

Therefore, in order to suppress the potential drop in the part where the second source contact 17 is brought into ohmic contact with the second well contact region 16, it is preferable to set the area of the second well contact region 16 below the second source contact 17 as large as possible. Specifically, the area of the second well contact region 16 below the second source contact 17 is preferably set to 1 time or larger and 100 times or smaller the area of the second source region 15 below the second source contact 17.

This, too, is illustrated in FIG. 5, and the area of the second well contact region 16 below the second source contact 17 is set larger than the area of the second source region 15 below the second source contact 17 by 2 times or more. Therefore, it is possible to suppress a potential drop in the part where the second source contact 17 is brought into ohmic contact with the second well contact region 16.

Although the differential contact resistance between the second source contact 17 and the second well contact region 16 becomes increased, there is an advantage that the manufacturing process is simplified.

The impurity concentration of the second source region 15 is $1.0 \times 10^{17}$ cm$^{-3}$ or higher and $1.0 \times 10^{21}$ cm$^{-3}$ or lower, and more preferably $1 \times 10^{19}$ cm$^{-3}$ or higher and $1 \times 10^{20}$ cm$^{-3}$ or lower. The impurity concentration of the second well contact region 16 is $1.0 \times 10^{18}$ cm$^{-3}$ or higher and $1.0 \times 10^{22}$ cm$^{-3}$ or lower, and more preferably $1.0 \times 10^{19}$ cm$^{-3}$ or higher and $1.0 \times 10^{21}$ cm$^{-3}$ or lower.

At this time, the sheet resistance of the second source region 15 is set lower than the sheet resistance of the second well contact region 16. This setting facilitate the flow of current through the second source region 15.

By using the configuration explained above, when the high dV/dt (time variation of voltage) of 20 V/nsec or higher is applied while the n-type silicon carbide MOSFET 100 is switched from the off state to the on state, for example, a larger proportion of the displacement current flowing from the second source contact 17 is allowed to flow into the non-element region of the second source contact 17 via the second source region, and to suppress the flow of the displacement current into the element region of the second source contact 17. Therefore, it is possible to reduce the voltage generated at the end of the second well region 13 that is on the side of the element region (the end of the second well region 13), to suppress the potential difference between the end of the second well region 13 and the boundary gate electrode 19, to suppress dielectric breakdown of the boundary gate insulating film 18, and to improve the reliability of the semiconductor device.

Second Embodiment

Figure 19:
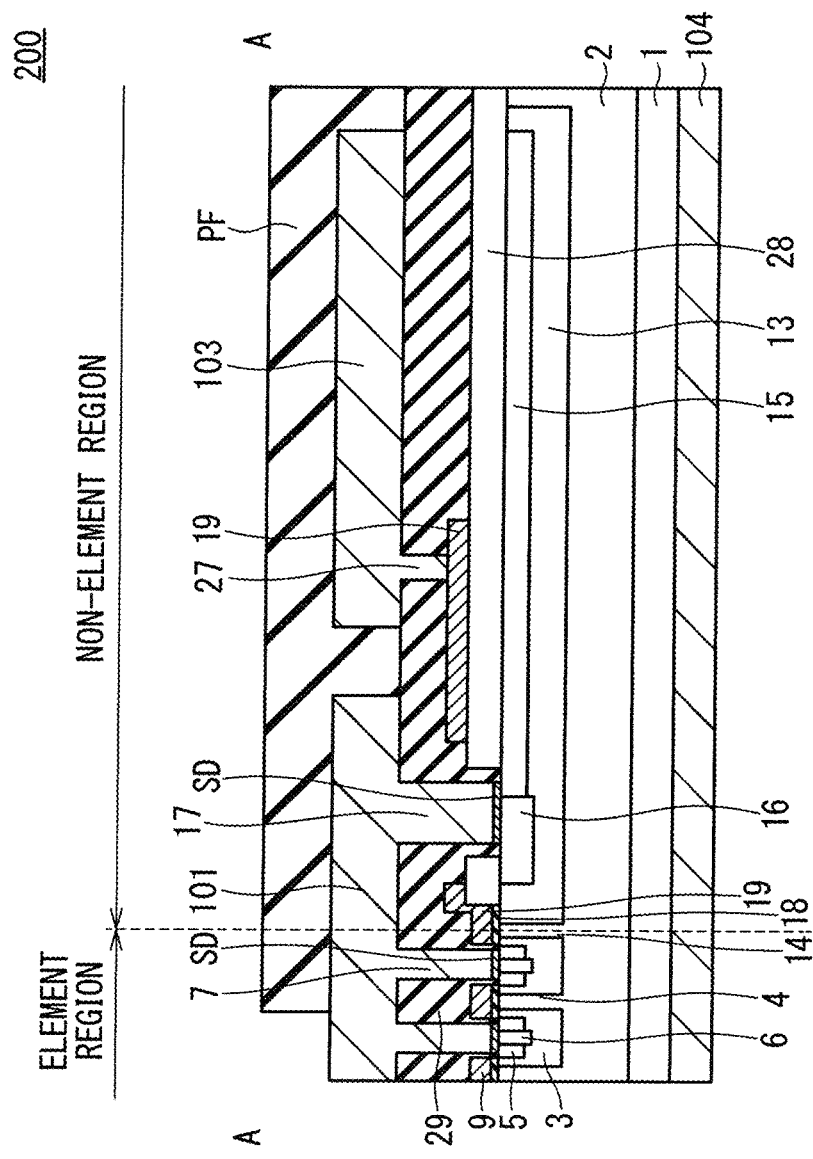
FIG. 19 is a cross-sectional view illustrating a configuration of a silicon carbide semiconductor device according to a second embodiment.

FIG. 19 is a cross-sectional view illustrating a configuration of an n-type silicon carbide MOSFET 200 according to a second embodiment, and corresponds to a cross-sectional view across the line A-A in FIG. 1, viewed in the direction of arrows. As illustrated in FIG. 19, in the n-type silicon carbide MOSFET 200, the part of the second well contact region 16 extending from the pn junction under the second source contact 17 to the element region only extends up to immediately below the field insulating film 28, and does not reach immediately below the boundary gate electrode 19.

Figure 20:
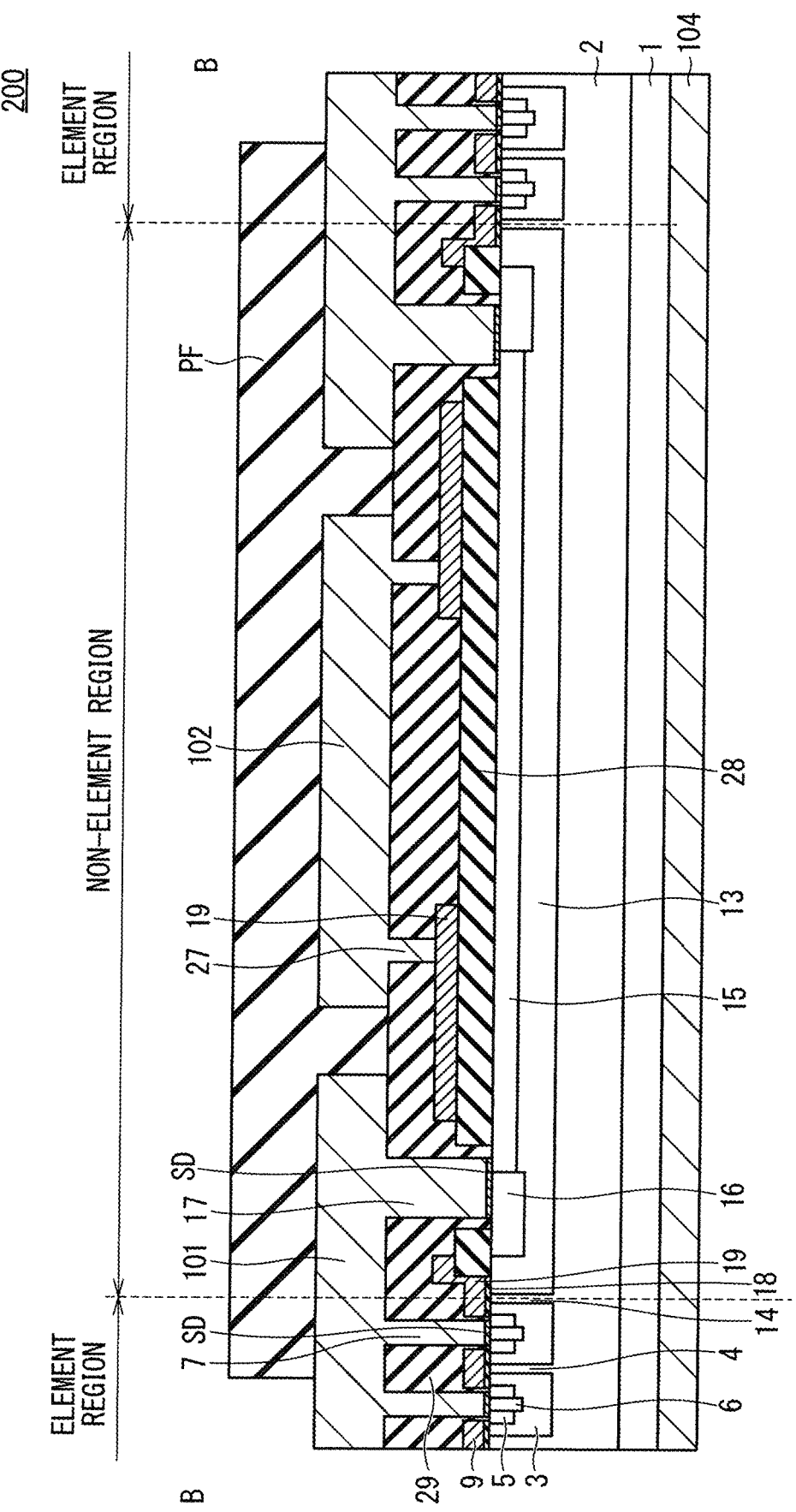
FIG. 20 is a cross-sectional view illustrating a configuration of the silicon carbide semiconductor device according to the second embodiment.

FIG. 20 is a cross-sectional view across the line B-B in FIG. 1 viewed in the direction of arrows, and is a cross-sectional view schematically illustrating a configuration of an element region and a non-element region that is a region where the gate pad 102 is formed. As illustrated in FIG. 20, the configuration of the element region and the non-element region is the same as the configuration illustrated in FIG. 19.

In the manner described above, in the n-type silicon carbide MOSFET 200 according to the second embodiment, because the second well contact region 16 does not reach below the boundary gate electrode 19, the boundary gate insulating film 18 is not formed on the high-concentration second well contact region 16, so that the film quality of the boundary gate insulating film 18 is improved. In other words, because the crystal structure is collapsed in the high-concentration impurity-implantation region, when the boundary gate insulating film 18 is formed on the impurity-implantation region, the homogeneity of boundary gate insulating film 18 deteriorates. However, in the configuration of the n-type silicon carbide MOSFET 200, this will not be an issue and the film quality, which is evaluated as a withstand voltage and a leakage current, is improved. Therefore, the effect of suppressing the dielectric breakdown of the boundary gate insulating film 18 is further enhanced, and the reliability as the semiconductor device is further improved.

Third Embodiment

Figure 21:
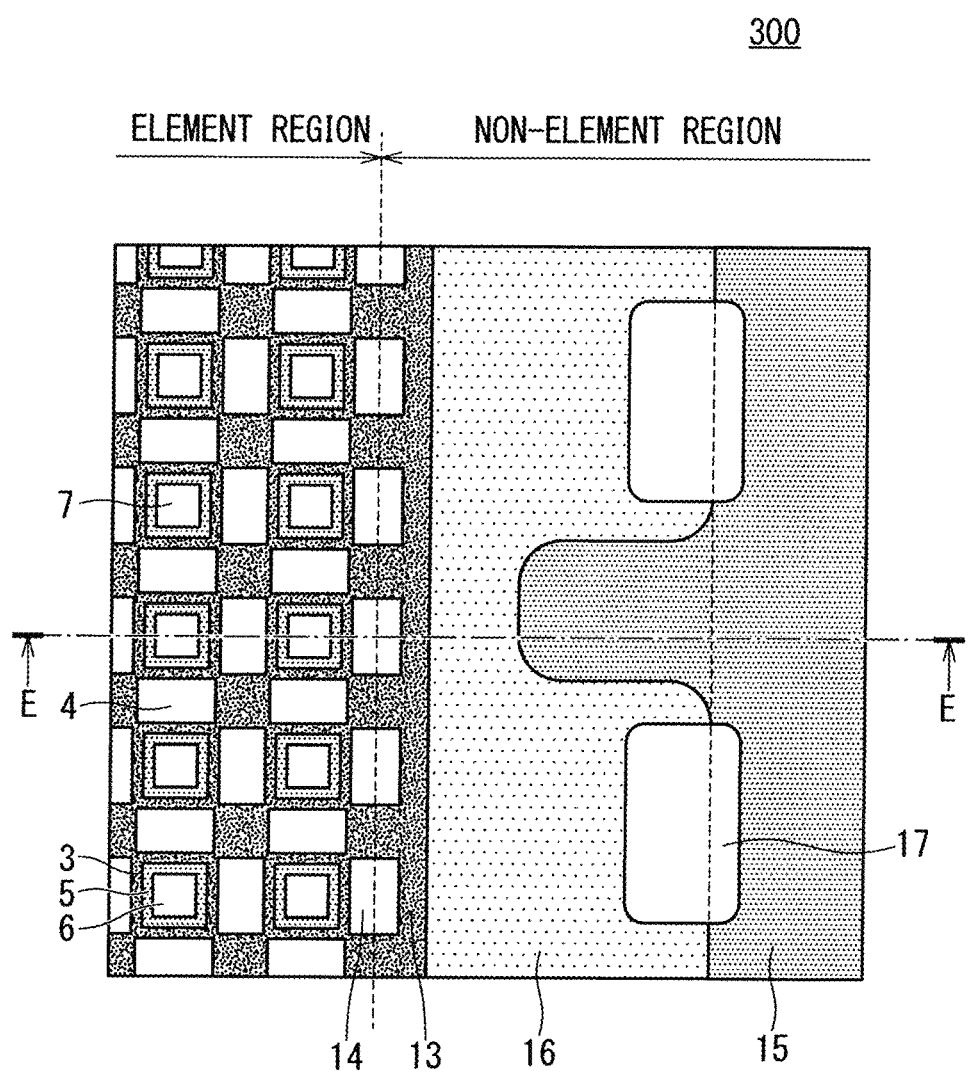
FIG. 21 is a partial plan view illustrating a configuration of a silicon carbide semiconductor device according to a third embodiment.

FIG. 21 is a plan view illustrating a configuration of an element region and a non-element region of a n-type silicon carbide MOSFET 300 according to a third embodiment, and corresponds to a plan view in the area X in FIG. 1. In the same manner as in FIG. 5, the sake of convenience, the insulating film and the electrode on the drift layer 2 are not illustrated, and only the configurations of the upper layer portions of the drift layer 2 are illustrated. In FIG. 21, the same components as those explained with reference to FIG. 5 are denoted by the same reference numerals, and redundant explanations thereof are omitted.

As illustrated in FIG. 21, in a part of the second well contact region 16 of the n-type silicon carbide MOSFET 300, the length by which the part extends from the junction with the second source region 15 toward the element region is shorter than that the part extending from the pn junction below the second source contact 17 toward the element region. The length of the second source region 15 is then extended by the length by which the second well contact region 16 is shortened. In a plan view, the second well contact region 16 partially recesses and the second source region 15 partially is projected toward the element region.

Note that, in FIG. 21, there is only one part where the second well contact region 16 is recessed and the second source region 15 is projected, between the two second source contacts 17. However, because the second source contact 17 is typically provided in plurality along the gate wiring 103 in the non-element region, the part where the second well contact region 16 is recessed and the second source region 15 is projected may be provided between each pair of the second source contacts 17.

Figure 22:
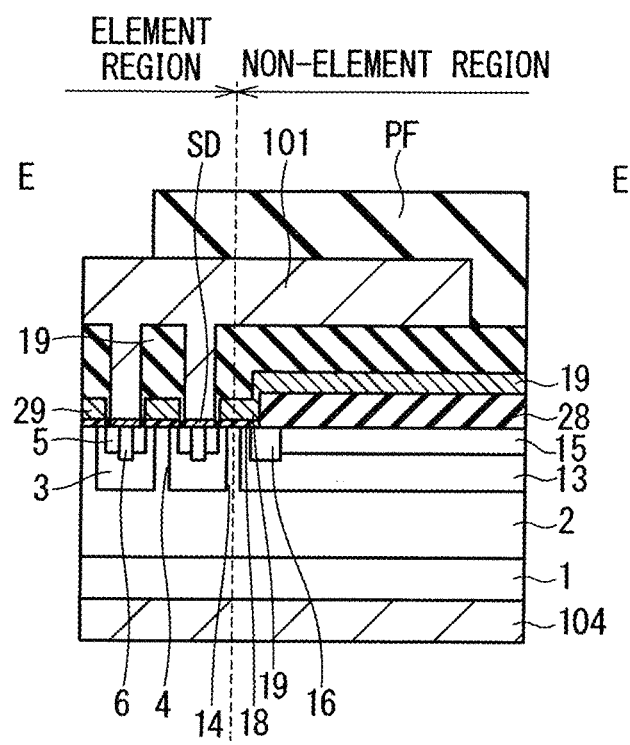
FIG. 22 is a cross-sectional view illustrating a configuration of the silicon carbide semiconductor device according to the third embodiment.

FIG. 22 is a cross-sectional view across the line D-D in FIG. 21, viewed in the direction of the arrows. As illustrated in FIG. 22, in the n-type silicon carbide MOSFET 300, the length of the second well contact region 16 is shorter than the length by which the second well contact region 16 extends from the junction with the second source region 15 toward the element region in the n-type silicon carbide MOSFET 100 illustrated in FIG. 3, and the second source region 15 is extended by that length.

As explained above, by reducing a part of the length of the second well contact region 16 and extending the second source region 15 by that length, when the n-type silicon carbide MOSFET 300 is switched from the off state to the on state, a larger proportion of the displacement current is allowed to flow from the second source contact 17 into the non-element region, rather than into the second source contact 17, via the second source region 15 having been extended, and to further suppress the displacement current flowing into the element region of the second source contact 17. Therefore, it is possible to further reduce the voltage generated in the end of the second well region 13 that is on the side of the element region (the end of the second well region 13), to further suppress the potential difference between the end of the second well region 13 and the boundary gate electrode 19, to further enhance the effect of suppressing the dielectric breakdown of the boundary gate insulating film 18, and to further improve the reliability as the semiconductor device.

Fourth Embodiment

Figure 23:
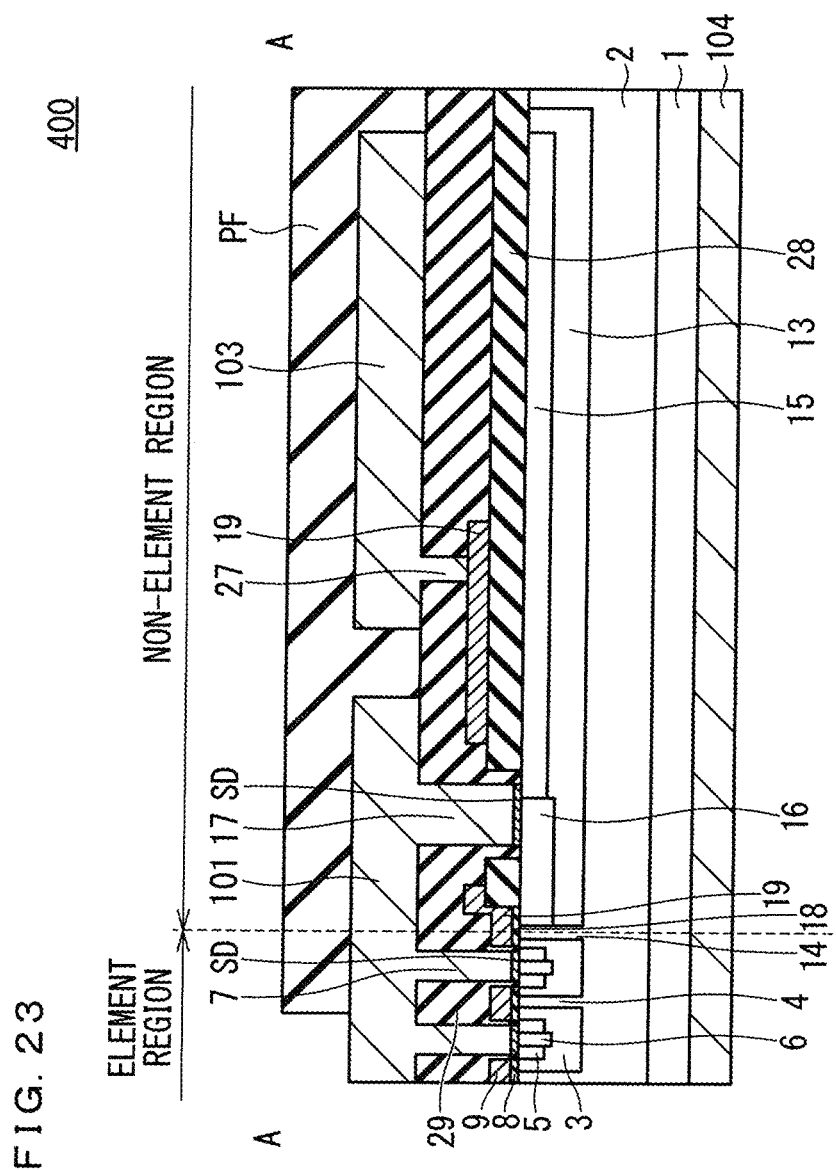
FIG. 23 is a cross-sectional view illustrating a configuration of a silicon carbide semiconductor device according to a fourth embodiment.

FIG. 23 is a cross-sectional view illustrating a configuration of an n-type silicon carbide MOSFET 400 according to a fourth embodiment, and corresponds to a cross-sectional view across the line A-A in FIG. 1, viewed in the direction of arrows. As illustrated in FIG. 23, in the n-type silicon carbide MOSFET 400, the part of the second well contact region 16 extending from the pn junction under the second source contact 17 toward the element region is provided up to the end of the second well region 13 (the end of the second well region 13).

Figure 24:
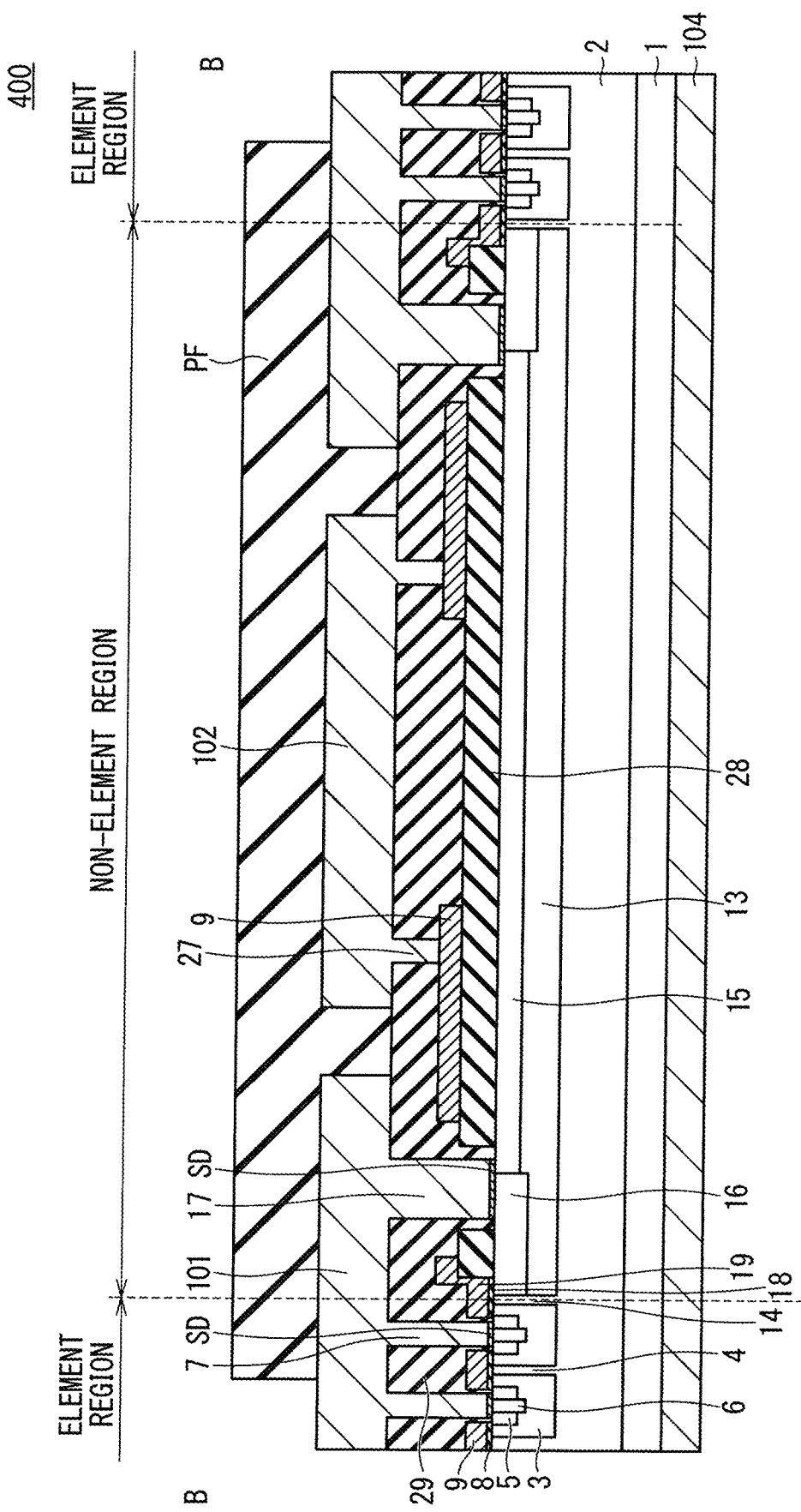
FIG. 24 is a cross-sectional view illustrating a configuration of the silicon carbide semiconductor device according to the fourth embodiment.

FIG. 24 is a cross-sectional view across the line B-B in FIG. 1, viewed in the direction of arrows, and is a cross-sectional view schematically illustrating a configuration of an element region and a non-element region that is a region where the gate pad 102 is formed. As illustrated in FIG. 24, the configurations of the element region and the non-element region are the same as those illustrated in FIG. 23.

As explained above, in the n-type silicon carbide MOSFET 400 according to the fourth embodiment, because the second well contact region 16 is provided in a manner extending up to the end of the second well region 13, it is possible to reduce the voltage generated at the end of the second well region 13, the voltage being generated when the n-type silicon carbide MOSFET 400 is switched from the off state to the on state.

In other words, because the sheet resistance of the second well contact region 16 is lower than the sheet resistance of the second well region 13, it is possible to bring the voltage generated at the end of the second well contact region 16 to a level lower than the voltage generated at the end of the second well region 13. As a result, the potential difference between the end of the second well region 13 and the boundary gate electrode 19 is further suppressed, and the effect of suppressing the dielectric breakdown of the boundary gate insulating film 18 is further enhanced. Moreover, the reliability as the semiconductor device is further improved.

Although the present disclosure has been explained in detail, every aspect of the above description is illustrative, and the present disclosure is not limited thereto. It is understood that numerous modifications not explained above are still possible without departing from the scope according to the present disclosure.

Note that, in the present disclosure, the embodiments may be combined in any way, and each of these embodiments may be modified or omitted as appropriate within the scope of the disclosure.

The invention claimed is:
1. A silicon carbide semiconductor device that includes an element region provided with a semiconductor element and a non-element region other than the element region, and in which a main current flows in a thickness direction of a silicon carbide substrate in the element region, the silicon carbide semiconductor device comprising:
a semiconductor layer of a first conductivity type, the semiconductor layer being provided on a first main surface of the silicon carbide substrate;
a first well region of a second conductivity type, the first well region being provided as an upper layer portion of the semiconductor layer in the element region;
a first impurity region of the first conductivity type, the first impurity region being provided as an upper layer portion of the first well region;
a first well contact region of the second conductivity type, the first well contact region being provided as the upper layer portion of the first well region and having a side surface bonded to the first impurity region;
a gate insulating film provided on an end portion of the first impurity region, and on the first well region and the semiconductor layer;
a gate electrode provided on the gate insulating film;
a first contact brought into ohmic contact with the first impurity region and the first well contact region, and electrically connected to a first main electrode provided above the semiconductor layer;
a second well region of the second conductivity type, the second well region being provided as an upper layer portion of the semiconductor layer of the non-element region;
a second impurity region of the first conductivity type, the second impurity region being provided as an upper layer portion of the second well region;
a second well contact region of the second conductivity type, the second well contact region being provided as the upper layer portion of the second well region and having a side surface bonded to the second impurity region;
a field insulating film provided on the second well region, and
at least one second contact passed through the field insulating film to form an ohmic contact with the second impurity region and the second well contact region, and electrically connected to the first main electrode;
a boundary gate insulating film provided across a range between an end portion of the second impurity region and the end portion of the first impurity region, the end portion of the second impurity region being an end portion on a side nearer to a boundary between the element region and the non-element region, and the end portion of the first impurity region being an end portion of the first well region that is adjacent to the boundary;
a boundary gate electrode provided on the boundary gate insulating film; and
a second main electrode provided on a second main surface of the silicon carbide substrate, the second main surface being on an opposite side of the first main surface, wherein
the second well contact region extends from below the at least one second contact toward the element region side, and
the second impurity region extends from below the at least one second contact toward the non-element region side.

2. The silicon carbide semiconductor device according to claim 1, wherein
the at least one second contact is a plurality of second contacts,
the second well contact region is provided continuously in a manner extending below the plurality of second contacts in a plan view, and
the second impurity region is provided continuously in a manner extending below the plurality of second contacts in a plan view.

3. The silicon carbide semiconductor device according to claim 1, wherein the second well contact region extends from below the at least one second contact to immediately below the boundary gate insulating film.

4. The silicon carbide semiconductor device according to claim 1, wherein the second well contact region is provided from below the at least one second contact by a length not reaching immediately below the boundary gate insulating film.

5. The silicon carbide semiconductor device according to claim 2, wherein, in the second well contact region, a part extending from a junction with the second impurity region toward the element region side between the plurality of second contacts is shorter than a part extending from the junction with the second impurity region below the at least one second contact toward the element region.

6. The silicon carbide semiconductor device according to claim 1, wherein the second well contact region extends from below the at least one second contact to an end of the second well region, the end being an end on a side of the element region.

7. The silicon carbide semiconductor device according to claim 1, wherein the second well contact region is brought into ohmic contact with the at least one second source contact across an area larger than an area across which the second impurity region is brought into ohmic contact with the at least one second source contact.

8. The silicon carbide semiconductor device according to claim 1, wherein the second well contact region is brought into ohmic contact with the at least one second source contact across an area 1 time or more and 100 times or less an area across which the second impurity region is brought into ohmic contact with the at least one second source contact.

9. The silicon carbide semiconductor device according to claim 1, wherein a concentration of a first conductivity type impurity in the second impurity region is $1.0 \times 10^{17}$ cm$^{-3}$ or higher and $1.0 \times 10^{21}$ cm$^{-3}$ or lower.

10. The silicon carbide semiconductor device according to claim 1, wherein a concentration of a first conductivity type impurity in the second impurity region is $1.0 \times 10^{19}$ cm$^{-3}$ or higher and $1.0 \times 10^{20}$ cm$^{-3}$ or lower.

11. The silicon carbide semiconductor device according to claim 1, wherein a concentration of a second conductivity type impurity in the second well contact region is $1.0 \times 10^{18}$ cm$^{-3}$ or higher and $1.0 \times 10^{22}$ cm$^{-3}$ or lower.

12. The silicon carbide semiconductor device according to claim 1, wherein a concentration of a second conductivity type impurity in the second well contact region is $1.0 \times 10^{19}$ cm$^{-3}$ or higher and $1.0 \times 10^{21}$ cm$^{-3}$ or lower.

13. The silicon carbide semiconductor device according to claim 1, wherein, in the second well contact region, a length of a part extending from a junction with the second impurity region below the at least one second contact toward the element region side is 1.0 μm or more and 100 μm or less.

14. The silicon carbide semiconductor device according to claim 1, wherein a sheet resistance of the second impurity region is lower than a sheet resistance of the second well contact region.

15. The silicon carbide semiconductor device according to claim 1, wherein a differential contact resistance between the second impurity region and the at least one second contact is smaller than a differential contact resistance between the second well contact region and the at least one second source contact.

16. The silicon carbide semiconductor device according to claim 1, wherein a time variation of a voltage applied between the first main electrode and the second main electrode is 20 V/nsec or higher.

* * * * *